US010149518B1

(12) United States Patent
de Iuliis et al.

(10) Patent No.: US 10,149,518 B1
(45) Date of Patent: Dec. 11, 2018

(54) CLASP ASSEMBLY FOR A WEARABLE DEVICE

(71) Applicant: Apple Inc., Cupertino, CA (US)

(72) Inventors: Daniele de Iuliis, Cupertino, CA (US); Trevor S. Chambers, Cupertino, CA (US); Thomas J. Waisanen, Seattle, WA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/382,585

(22) Filed: Dec. 16, 2016

Related U.S. Application Data

(60) Provisional application No. 62/371,857, filed on Aug. 8, 2016.

(51) Int. Cl.

| | |
|---|---|
| ***G06F 1/16*** | (2006.01) |
| ***A44C 5/00*** | (2006.01) |
| ***A44C 5/14*** | (2006.01) |
| ***A44C 5/18*** | (2006.01) |
| ***A44C 5/20*** | (2006.01) |
| ***A44C 27/00*** | (2006.01) |
| ***A44C 5/24*** | (2006.01) |
| ***H05K 5/02*** | (2006.01) |
| ***H05K 5/00*** | (2006.01) |

(52) U.S. Cl.
CPC .......... *A44C 5/0007* (2013.01); *A44C 5/0053* (2013.01); *A44C 5/14* (2013.01); *A44C 5/185* (2013.01); *A44C 5/2071* (2013.01); *A44C 5/246* (2013.01); *A44C 27/00* (2013.01); *H05K 5/0017* (2013.01); *H05K 5/0226* (2013.01)

(58) Field of Classification Search
CPC .......................................................... G06F 1/16
USPC ...................................................... 361/679.01
See application file for complete search history.

(56) References Cited

U.S. PATENT DOCUMENTS

| | | | |
|---|---|---|---|
| 2,126,263 | A | 8/1938 | Kestenman |
| 2,346,887 | A | 4/1944 | Winkler |
| 2,408,279 | A | 9/1946 | Valcourt |
| 2,505,044 | A | 4/1950 | Heinrich |
| 2,518,551 | A | 8/1950 | Jaccarino |
| 3,293,714 | A | 12/1966 | Shafer |

(Continued)

FOREIGN PATENT DOCUMENTS

| | | |
|---|---|---|
| CN | 2052214 | 2/1990 |
| CN | 1147358 | 4/1997 |

(Continued)

OTHER PUBLICATIONS

Author Unknown, "Ikepod Wristwatches by Mark Newson," http://www.dezeen.com/2007/12/10/ikepod-wristwatches-by-marc-newson/, 32 pages, Dec. 10, 2007.

(Continued)

*Primary Examiner* — Jerry Wu
(74) *Attorney, Agent, or Firm* — Morgan, Lewis & Bockius LLP

(57) ABSTRACT

An attachment strap for a wearable electronic device is disclosed. The attachment strap attaches the wearable electronic device to a wearer, and may attach to a wrist of a wearer. The attachment strap includes two bands which attach to a clasp. The clasp operates in an open and closed configuration. When in the closed configuration, the clasp may not present a visible indication of its mechanism.

11 Claims, 15 Drawing Sheets

(56) References Cited

U.S. PATENT DOCUMENTS

| | | | | |
|---|---|---|---|---|
| 3,376,616 | A | 4/1968 | Kaczorowski | |
| 3,589,341 | A | 6/1971 | Krebs | |
| 3,675,284 | A | 7/1972 | Rieth | |
| 3,740,804 | A | 6/1973 | Levinger | |
| 3,747,171 | A | 7/1973 | Montague, Jr. | |
| 4,136,805 | A | 1/1979 | Storms | |
| 4,178,751 | A | 12/1979 | Liautaud | |
| 4,249,267 | A | 2/1981 | Voss | |
| 4,414,714 | A | 11/1983 | Kostanecki et al. | |
| 4,447,238 | A | 5/1984 | Eldridge, Jr. | |
| 4,615,185 | A | 10/1986 | Bollinger | |
| 4,941,236 | A | 7/1990 | Sherman et al. | |
| 5,130,899 | A | 7/1992 | Larkin et al. | |
| 5,146,437 | A | 9/1992 | Boucheron | |
| 5,244,134 | A | 9/1993 | Riley | |
| 5,305,503 | A | 4/1994 | Yamagata | |
| 5,307,582 | A | 5/1994 | Quintel | |
| 5,668,784 | A | 9/1997 | Iguchi | |
| 5,914,913 | A | 6/1999 | Shriqui | |
| 6,067,692 | A | 5/2000 | Chang | |
| 6,163,938 | A | 12/2000 | Weber-Unger | |
| 6,170,131 | B1 | 1/2001 | Shin | |
| 6,179,025 | B1 | 1/2001 | Sutton | |
| 6,292,985 | B1 | 9/2001 | Grunberger | |
| 6,311,373 | B1 * | 11/2001 | Hashimoto .............. | A44C 5/24 24/265 WS |
| 6,505,385 | B2 | 1/2003 | Grunberger | |
| 6,588,069 | B2 | 7/2003 | Deriaz et al. | |
| 6,598,271 | B2 | 7/2003 | Nire | |
| 6,606,767 | B2 | 8/2003 | Wong | |
| 6,647,597 | B2 | 11/2003 | Reiter | |
| 6,678,898 | B2 | 1/2004 | Jones et al. | |
| 6,701,580 | B1 | 3/2004 | Bandyopadhyay | |
| 6,726,070 | B2 | 4/2004 | Lautner | |
| 6,746,058 | B2 | 6/2004 | Kienzler | |
| 7,243,824 | B2 | 7/2007 | Tabata | |
| 7,249,398 | B2 | 7/2007 | Roy | |
| 7,296,752 | B2 | 11/2007 | Carnevali | |
| 7,363,687 | B2 | 4/2008 | Kraus et al. | |
| 7,373,696 | B2 | 5/2008 | Schoening et al. | |
| 7,451,528 | B2 | 11/2008 | Sima | |
| 7,618,260 | B2 | 11/2009 | Daniel et al. | |
| 7,640,632 | B2 | 1/2010 | Lazarus | |
| 7,806,309 | B2 | 10/2010 | Korchmar | |
| 7,810,683 | B2 | 10/2010 | Chan | |
| 7,905,039 | B2 | 3/2011 | Karovic | |
| 8,088,043 | B2 | 1/2012 | Andren et al. | |
| 8,091,261 | B2 | 1/2012 | Chadwick | |
| 8,261,416 | B2 | 9/2012 | Rothbaum et al. | |
| 8,316,515 | B2 | 11/2012 | Slank | |
| 8,328,055 | B1 | 12/2012 | Snyder | |
| 8,471,658 | B2 | 6/2013 | Fullerton et al. | |
| 8,474,669 | B2 | 7/2013 | Rohrbach et al. | |
| 8,486,481 | B2 | 7/2013 | Giuseppin et al. | |
| 8,573,458 | B1 | 11/2013 | Hamilton | |
| 8,578,569 | B1 | 11/2013 | Karnoski et al. | |
| 8,615,849 | B2 | 12/2013 | Rothbaum | |
| 8,662,362 | B1 | 3/2014 | Bastian et al. | |
| 8,787,006 | B2 | 7/2014 | Golko et al. | |
| 8,789,246 | B2 | 7/2014 | Yliluoma et al. | |
| 8,857,683 | B2 | 10/2014 | Cameron et al. | |
| 8,967,437 | B2 | 3/2015 | Wilson | |
| 9,003,611 | B2 | 4/2015 | Catanese | |
| 9,049,894 | B2 | 6/2015 | Wong | |
| 9,101,184 | B2 | 8/2015 | Wilson | |
| 9,245,678 | B2 | 1/2016 | Fiedler | |
| 9,258,670 | B2 | 2/2016 | Goyal et al. | |
| 9,314,092 | B2 | 4/2016 | Wang et al. | |
| 9,351,551 | B2 | 5/2016 | Morgan et al. | |
| 9,357,817 | B2 | 6/2016 | Lee et al. | |
| 9,392,829 | B2 | 7/2016 | Manuello | |
| 2005/0102802 | A1 | 5/2005 | Sitbon et al. | |
| 2005/0265132 | A1 | 12/2005 | Ho | |
| 2006/0156520 | A1 | 7/2006 | Meranto | |
| 2006/0186150 | A1 | 8/2006 | Willows et al. | |
| 2006/0254105 | A1 | 11/2006 | Chang | |
| 2007/0028429 | A1 | 2/2007 | Ishida | |
| 2007/0070823 | A1 | 3/2007 | Sima | |
| 2009/0133438 | A1 | 5/2009 | Stampfli et al. | |
| 2009/0265832 | A1 | 10/2009 | Clement | |
| 2010/0200627 | A1 | 8/2010 | Shen | |
| 2010/0258601 | A1 | 10/2010 | Thrope | |
| 2010/0327030 | A1 | 12/2010 | Yang | |
| 2011/0083254 | A1 | 4/2011 | Trutna et al. | |
| 2011/0309121 | A1 | 12/2011 | Dooley et al. | |
| 2012/0152990 | A1 | 6/2012 | Kulas | |
| 2013/0086774 | A1 | 4/2013 | Krasinski et al. | |
| 2013/0205476 | A1 | 8/2013 | Gentile et al. | |
| 2013/0326790 | A1 | 12/2013 | Cauwels et al. | |
| 2016/0003269 | A1 | 1/2016 | Russell-Clarke et al. | |
| 2016/0010673 | A1 | 1/2016 | Russell-Clarke et al. | |
| 2016/0025119 | A1 | 1/2016 | Russell-Clarke et al. | |
| 2016/0037878 | A1 | 2/2016 | Yabe et al. | |
| 2016/0058375 | A1 | 3/2016 | Rothkopf | |
| 2016/0069371 | A1 | 3/2016 | Chen et al. | |
| 2016/0128209 | A1 | 5/2016 | Yoon et al. | |
| 2016/0154425 | A1 | 6/2016 | Yang et al. | |
| 2016/0192526 | A1 | 6/2016 | Gao et al. | |
| 2016/0215799 | A1 | 8/2016 | Ely et al. | |
| 2016/0261037 | A1 | 9/2016 | Chen et al. | |
| 2016/0278203 | A1 | 9/2016 | Nakayama | |
| 2017/0086538 | A1 | 3/2017 | Siahaan | |

FOREIGN PATENT DOCUMENTS

| | | |
|---|---|---|
| CN | 2575724 | 9/2003 |
| CN | 200983868 | 12/2007 |
| CN | 201709560 | 1/2011 |
| CN | 102202533 | 9/2011 |
| CN | 202026953 | 11/2011 |
| CN | 202587325 | 12/2012 |
| CN | 202664274 | 1/2013 |
| CN | 202704189 | 1/2013 |
| CN | 103488076 | 1/2014 |
| EP | 2098131 | 3/2009 |
| EP | 2633776 | 9/2013 |
| FR | 1291875 | 4/1962 |
| FR | 2492238 | 4/1982 |
| FR | 2532239 | 3/1984 |
| GB | 464417 | 4/1937 |
| GB | 1491532 | 11/1977 |
| GB | 2113975 | 8/1983 |
| GB | 2355281 | 4/2001 |
| JP | H06189814 | 7/1994 |
| JP | 2001060997 | 3/2001 |
| JP | 2005143988 | 6/2005 |
| JP | 2005318247 | 11/2005 |
| JP | 2006102026 | 4/2006 |
| JP | 3134581 | 8/2007 |
| JP | 2009124652 | 6/2009 |
| JP | 2012248580 | 12/2012 |
| KR | 200320475 | 7/2003 |
| KR | 200396918 | 9/2005 |
| WO | WO2010/036090 | 4/2010 |
| WO | WO2011/0048344 | 4/2011 |
| WO | WO2012/160195 | 11/2012 |

OTHER PUBLICATIONS

Author Unknown, "Tajan," http://www.tajan.com/pdf/7812.pdf, 2 pages, Dec. 10, 2007.

Author Unknown, v2.0 Ikepod Has Landed . . . again . . . , http://qp.granularit.com/media/38876/QP24_Ikepod.pdf, 3 pages, at least as early as Apr. 25, 2015.

* cited by examiner

CLASP ASSEMBLY FOR A WEARABLE DEVICE

CROSS-REFERENCE TO RELATED APPLICATION(S)

This application is a nonprovisional patent application of and claims the benefit of U.S. Provisional Patent Application No. 62/371,857, filed Aug. 8, 2016 and titled "Clasp Assembly for a Wearable Device," the disclosure of which is hereby incorporated herein by reference in its entirety.

FIELD

The described embodiments relate generally to wearable devices. More particularly, the present embodiments relate to attachment straps for wearable devices.

BACKGROUND

Conventional wearable devices, such as wristwatches, include straps that couple the device to a user. For example, a conventional wristwatch typically includes a strap that attaches the watch to a user's wrist. Straps may be formed from various materials, such as fabric, leather, links, and the like. In order for straps to be applied to and removed from a user, straps may use clasps, buckles, or other closure mechanisms that allow the strap to expand or open so that a user can apply the device to a desired body part or object, and also secure the strap together (at a smaller size) to retain the device to the wearer.

SUMMARY

Embodiments of the present disclosure relate to attachment straps for a wearable device. A pair of bands are coupled together by a clasp to form an attachment strap. The clasp may have a minimal appearance when closed, such that the pair of bands may appear as a nearly continuous band. In addition, the closing mechanism of the clasp may be hidden from view while the clasp is closed, as well as while the clasp is open.

In a first embodiment, an attachment strap for a wearable device includes a first band which attaches to a first portion of the wearable device. A second band attaches to a second portion of the wearable device, and a clasp attaches the first band to the second band. The first band includes a rigid insert positioned between two outer layers of the band. The clasp has a receiving portion which couples to the rigid insert of the first band, and the clasp also has a receiving portion for the second band.

In another embodiment, an electronic device includes a housing, and a first and second band which attach to sides of the housing A clasp attaches the first band to the second band. The clasp includes a flexible linking portion having a first attachment feature along a majority of a length of the flexible linking portion and a rigid linking portion having a second attachment feature along a majority of a length of the rigid linking portion. The first attachment feature couples to the second attachment feature. A hinge operably connects the flexible linking portion and the rigid linking portion and moves the flexible linking portion toward and through the rigid linking portion.

In still another embodiment, a method for assembling a band for a wearable device includes the steps of bonding a rigid insert to a first end of a molded component and placing the molded component adjacent a core layer. A first outer layer is bonded to the rigid insert, the molded component, and the core layer. A second outer layer is bonded to the rigid insert, the molded component, and the core layer. The first outer layer is bonded to the second outer layer. An attachment pin is placed through the rigid insert and the attachment pin is attached to a clasp which attaches to the band.

BRIEF DESCRIPTION OF THE DRAWINGS

The disclosure will be readily understood by the following detailed description in conjunction with the accompanying drawings, wherein like reference numerals designate like structural elements.

Figure 1:
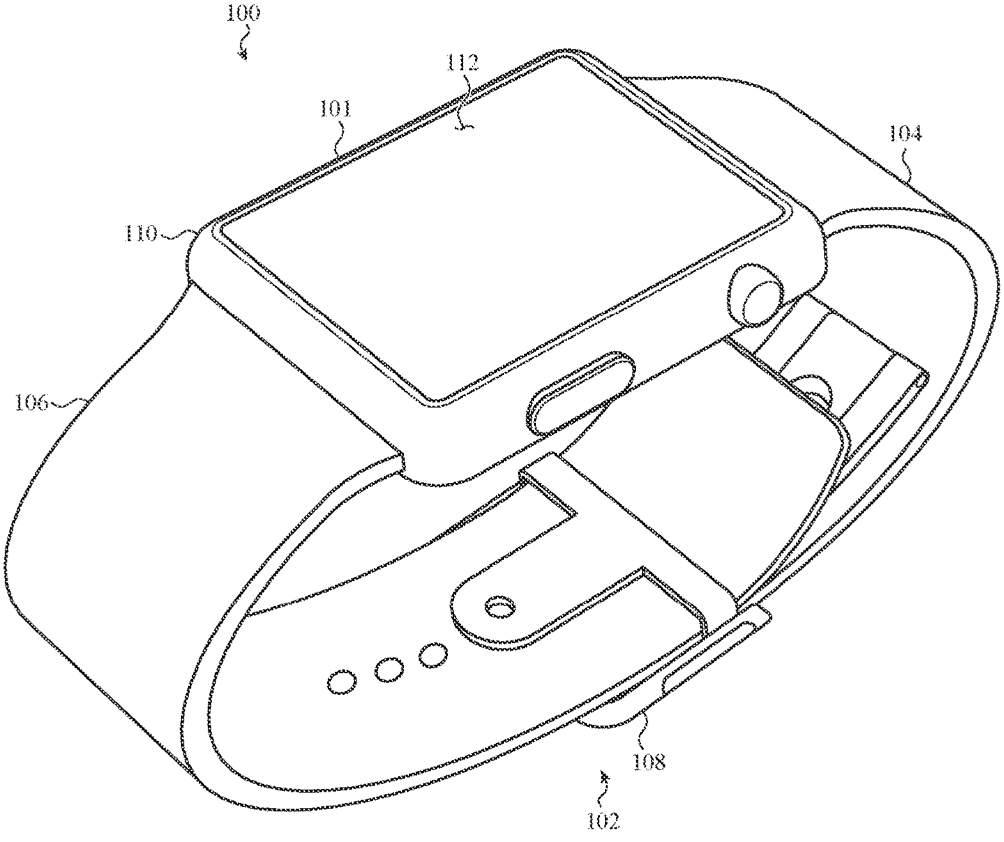
FIG. 1 depicts a wearable electronic device having a strap incorporating features of the present disclosure.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

Wearable devices, such as watches, are typically secured to a wearer or to an object with a strap. Some straps are composed of flexible materials, such as fabrics, leather, polymers, or the like. Other straps have multiple rigid links that can articulate with respect to one another to allow the strap to flex to conform to a wearer's wrist. Discussed herein are straps that use a hinged clasp to facilitate coupling a wearable device to a wearer.

For example, the clasp may be designed such that when the clasp is closed (e.g., around a wearer's wrist) the closing mechanism of the clasp may be hidden from view. While the clasp is open, at least a portion of its closing mechanism may not be apparent. The clasp itself may be minimally visible as well, giving the visual appearance of a near-continuous strap. The clasp may also be designed such that the strap will have few protrusions, reducing the likelihood that the clasp or one of the bands that attach to it will snag on objects when worn.

The strap may include two bands attached together by the clasp. The bands may be termed a "head band" and a "tail band." The head band may typically be fixed to the clasp, while the tail band may be removable from the clasp. The tail band may also provide adjustability for the size of the strap. For example, the tail band may have a series of holes along its length such that a post may be placed through one of the holes to attach the clasp at a desirable point on the tail band. In some embodiments, both the head band and the tail band may be removable from the clasp (e.g., to allow for repair, maintenance, or replacement of the bands or clasp).

The bands may attach to separate receiving portions of the clasp. The receiving portions of the clasp may be adjoined by a hinge. The hinge may allow the portions of the clasp to fold from an open to a closed position. When closed, the hinge may place one of the bands, such as the head band, in a position overlaying the other band. The head band may overlay the hinge and the majority of the clasp, hiding the clasp mechanism from view.

The head band may have and/or maintain a relatively thin cross-section, and may additionally visually conceal its point of attachment to the clasp. To achieve these ends, the head band in this disclosure may directly attach to the clasp by means of a spring pin placed through the band, rather than being looped around an attachment feature. The head band may include internal features that add rigidity and/or provide a location through which the spring pin may pass, particularly in embodiments where the head band is made from a flexible material. The spring pin may also be designed to have a low profile while maintaining or increasing its strength.

Even while the clasp is open, its latching mechanism may not be readily apparent to a wearer. The clasp may include a flexible linking portion and a rigid linking portion that are attached to one another by a hinge. When the clasp is closed, the flexible linking portion may pass inside the rigid linking portion. Both the flexible linking portion and the rigid linking portion may have a latching feature along a portion of their lengths which abut one another when the clasp is closed. The latching features facilitate a secure latch when the clasp is closed, but may be less discernible when the clasp is open. The clasp may also include buttons (or other release structures) connected to the flexible linking portion which, when pressed, cause the flexible linking portion to flex away from the rigid linking portion, thereby releasing the latching features and opening the clasp.

These and other embodiments are discussed below with reference to FIGS. 1-13. However, those skilled in the art will readily appreciate that the detailed description given herein with respect to these Figures is for explanatory purposes only and should not be construed as limiting.

FIG. 1 depicts a wearable electronic device 100 having a strap incorporating features disclosed herein with respect to various embodiments. The wearable electronic device 100 includes a two-band attachment system (together forming an attachment strap 102) for securing to a wrist of a wearer or any other body part or suitable structure. An attachment strap 102 includes a head band (e.g., a first band) 104 and a tail band 106 (e.g., a second band) coupled to a clasp 108. In many examples, the wearable electronic device may be or include a multifunction device 101, as described in more detail at the end of this specification.

As noted above, the wearable electronic device 100 can be removably connected to a wearer (or removably or permanently attached to another object) via an attachment strap 102. The attachment strap 102 may be configured to attach to the housing 110 and provide a loop for securing the wearable electronic device 100 to the wrist of a wearer or to any other suitable object. The attachment strap 102 can be integral with the housing 110 or it can be a separate part. If integral to the housing 110, the attachment strap 102 is a continuation of the housing 110. In some cases, the attachment strap 102 is partially formed from the same material as the housing 110. If the attachment strap 102 is separate from the housing 110, it may be fixed or releasably coupled to the housing 110. The attachment strap 102 may be formed from similar or different materials as the housing 110.

In some embodiments, the attachment strap 102 may include a head band 104 and a tail band 106 attached to opposite sidewalls of the housing 110. The head band 104 and the tail band 106 operate in an open and closed configuration for the attachment strap 102. For example, each of the head band 104 and the tail band 106 may attach to a clasp 108. The clasp 108 allows a wearer to open the strap 102 for placement on a wrist and, thereafter, close the strap 102 in order to secure the wearable electronic device 100 and the strap 102 to the wrist. In other embodiments the attachment strap 102 may be formed as a single band with a middle portion coupled to the housing 110 and ends which attach to the clasp 108.

The head band 104 and tail band 106 may be flexible to facilitate attachment of the wearable electronic device 100, and to provide a comfortable and secure fit to a wearer. The head band 104 and tail band 106 may be flexible along substantially their whole lengths, or only along certain portions.

The head band 104 and tail band 106 may be formed from or include any appropriate materials. For example, each of the head band 104 and the tail band 106 may include one or more layers of flexible material, such as fabrics (e.g., natural or synthetic fabrics), polymers (e.g., silicone, thermoplastic polyurethane (TPU), polyvinylchloride, rubber, or fluoroelastomer), leather, metal, mesh, links and/or the like. Example layers forming the head band 104 (and/or the tail band 106) are further illustrated below with respect to FIG. 12.

The clasp 108 may removably attach the head band 104 to the tail band 106. The head band 104 may be fixed to the clasp 108, while the tail band 106 may be removable from the clasp 108. In some embodiments, both the head band 104 and the tail band 106 may be removable from the clasp 108 (e.g., for maintenance and/or replacement). The tail band 106 may include multiple attachment points or an attachment area, allowing for the attachment strap 102 to be adjusted in size. The clasp 108 may further provide for a portion of the tail band 106, such as excess length, to pass underneath the head band 104. Features of the clasp are further illustrated below with respect to FIGS. 3A-6B.

Figure 2:
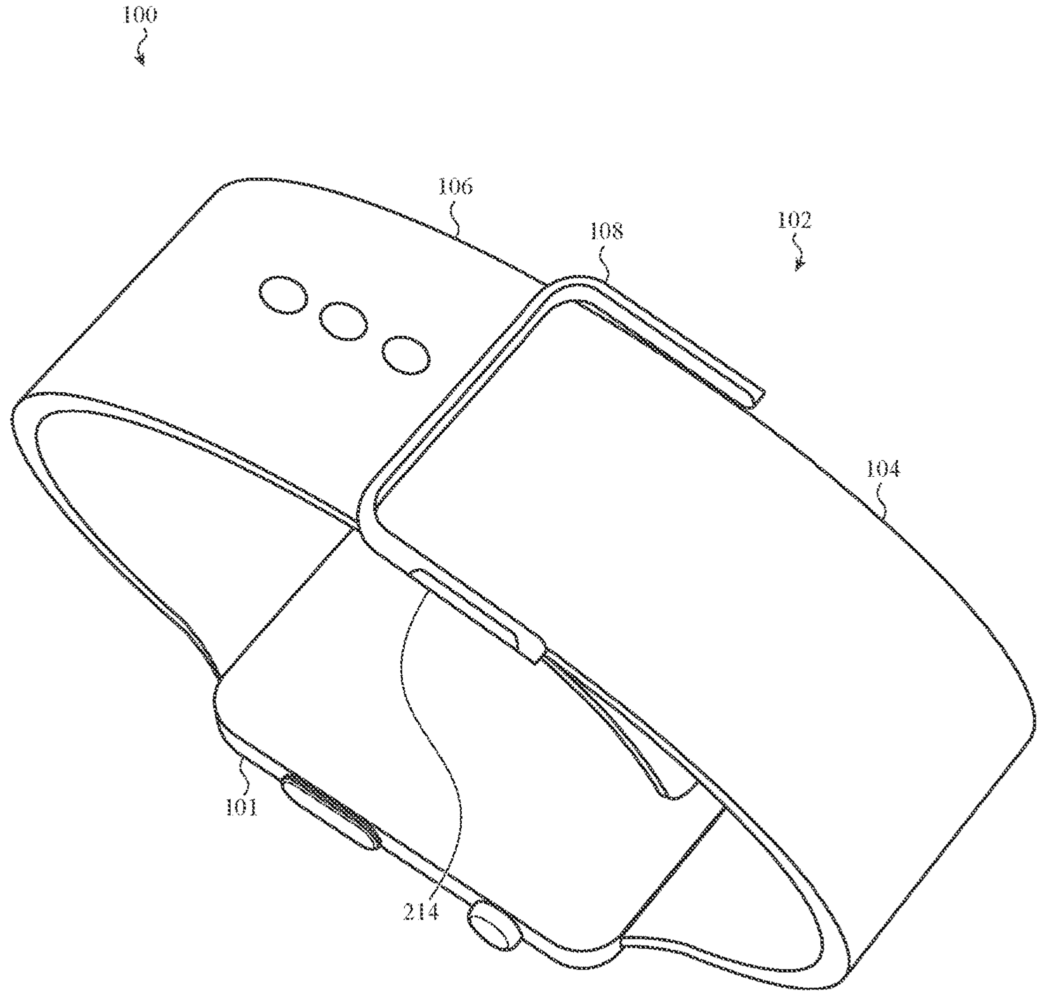
FIG. 2 depicts a rotated view of the wearable electronic device depicted in FIG. 1.

As shown in FIG. 2, the clasp 108 may be formed such that the function of its closing mechanism is not visible when it is closed, since the head band 104 may obscure much of the clasp 108. This may present an aesthetically pleasing view to a wearer, and may result in the attachment strap 102 having the appearance of a near-continuous band. Further, the design of the clasp 108 may present fewer protrusions than traditional attachment straps, decreasing the risk of the wearable electronic device 100 being caught on objects.

FIG. 2 depicts another view of the wearable electronic device 100 depicted in FIG. 1. The wearable electronic device 100 is depicted with a multifunction device 101 attached to a head band (e.g., a first band) 104 and a tail band (e.g., a second band) 106 of an attachment strap 102. The head band 104 is coupled to the tail band 106 via a clasp 108, depicted here in a closed configuration. The clasp 108 includes a release button 214, which operates to release the clasp 108 from its closed configuration. In the closed configuration, the clasp 108 operates to place a portion of the head band 104 over the tail band 106.

Figure 3A:
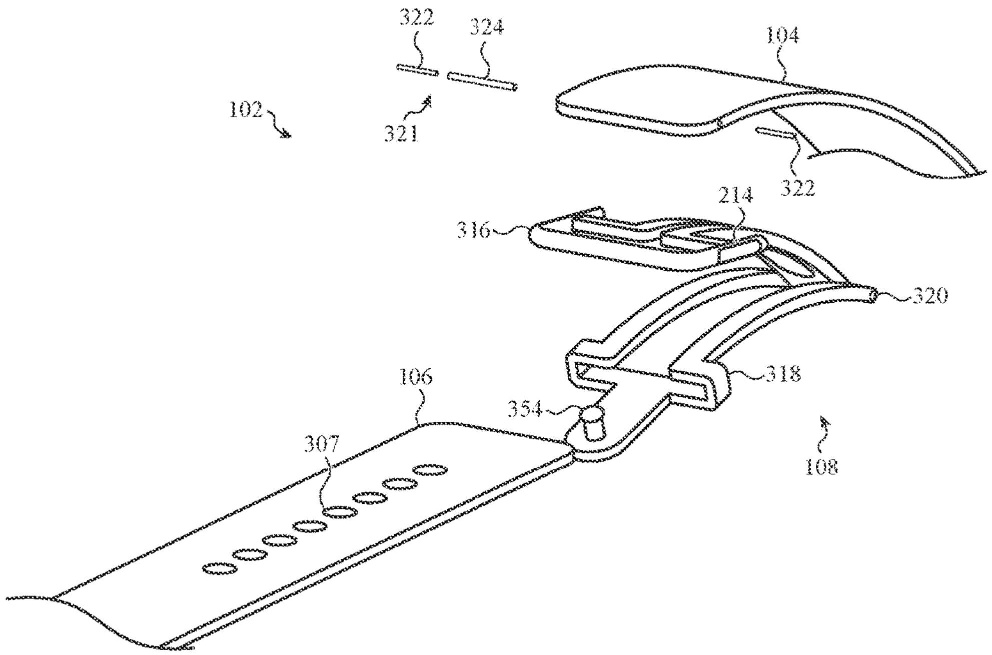
FIG. 3A depicts an exploded view of an attachment strap for the wearable electronic device.
Figure 3B:
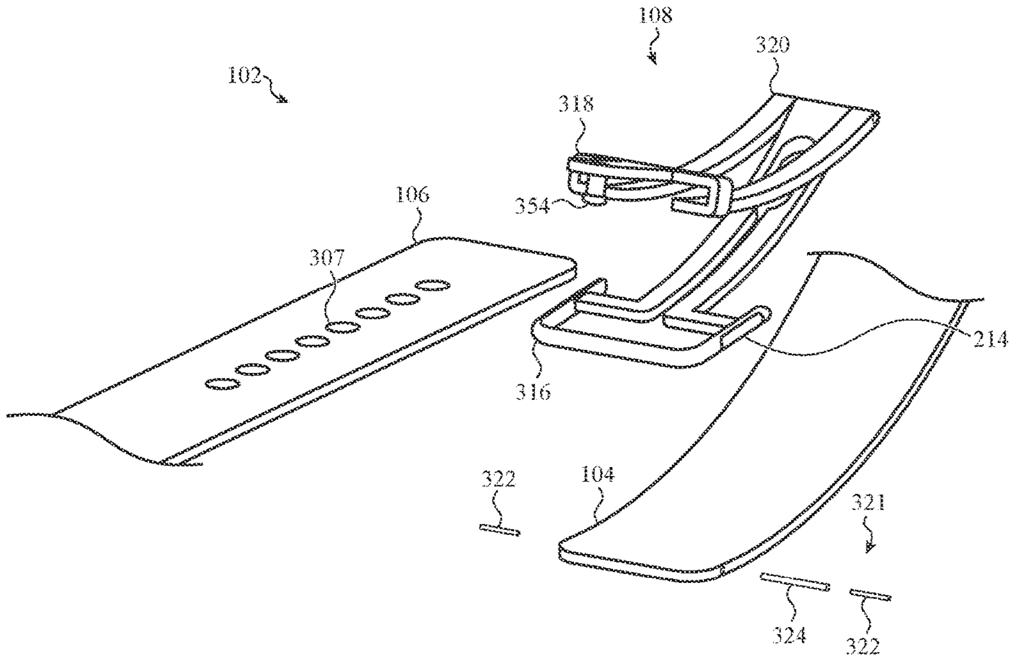
FIG. 3B depicts another exploded view of the attachment strap for a wearable device.

FIGS. 3A and 3B depict exploded views of a sample attachment strap 102 for a wearable electronic device. These views illustrate the attachment of the clasp 108 to the head band 104 and the tail band 106. FIGS. 3A and 3B also illustrate the clasp 108 in greater detail.

As shown in FIGS. 3A and 3B, the clasp 108 includes a head band receiving portion (e.g., a first band receiving portion) 316 coupled to a tail band receiving portion (e.g., a second band receiving portion) 318 by a hinge 320. The hinge 320 provides for the head band receiving portion 316 and the tail band receiving portion 318 to move or pivot between an open configuration and a closed configuration (shown in FIGS. 3A and 3B in an open configuration). The clasp 108 may include latching features to hold the head band portion 316 and the tail band portion 318 in a closed configuration. Example latching features are illustrated below with respect to FIGS. 4A-6B. A release button 214 may facilitate releasing the latching features such that the head band portion 316 and the tail band portion 318 may move or swivel at the hinge, changing from the closed configuration to the open configuration.

The head band receiving portion 316 attaches to an end of the head band 104. The head band 104 may include one or more attachment features, such as a spring pin 321. The spring pin 321 may include a pair of retention pins 322 coupled to a spring 324. An opening may be provided through the head band 104 and the spring pin 321 may be positioned within the opening. The spring pin 321 may attach the head band 104 to the head band receiving portion 316.

The tail band receiving portion 318 adjustably attaches to the tail band 106. The tail band receiving portion 318 may contain one or more attachment features which allow for a wearer to adjust the size of the attachment strap 102. In the example shown, the tail band receiving portion 318 includes a stud (e.g., post) 354 which may penetrate one or a series of holes 307 in the tail band 106. The series of holes 307 may allow a wearer to tighten the attachment strap by placing the stud 354 through a hole 307 which is closer to the multifunction device.

The stud 354 and holes 307 are illustrated in a round shape. In some embodiments, the stud 354 and/or holes 307 may be formed in a variety of shapes, including square, rectangular, triangular, and other shapes, including non-regular geometric shapes. In addition, the stud 354 is illustrated having a flared head, but in other embodiments this may be omitted or replaced with another retention feature for retaining the tail band 106.

The clasp 108 and its function are further detailed below with respect to FIGS. 4A-6B. Configuration of the head band is further detailed below with respect to FIGS. 7-9F. Attachment of the spring pin 321 to the head band receiving portion 316 of the clasp 108 is further illustrated below with respect to FIGS. 10A-10C. Embodiments of the spring pin 321 are further illustrated below with respect to FIGS. 11A-1E. Example layers and a method of assembly of the head band are detailed below with respect to FIGS. 12-13.

Design of the Clasp

Figure 4A:
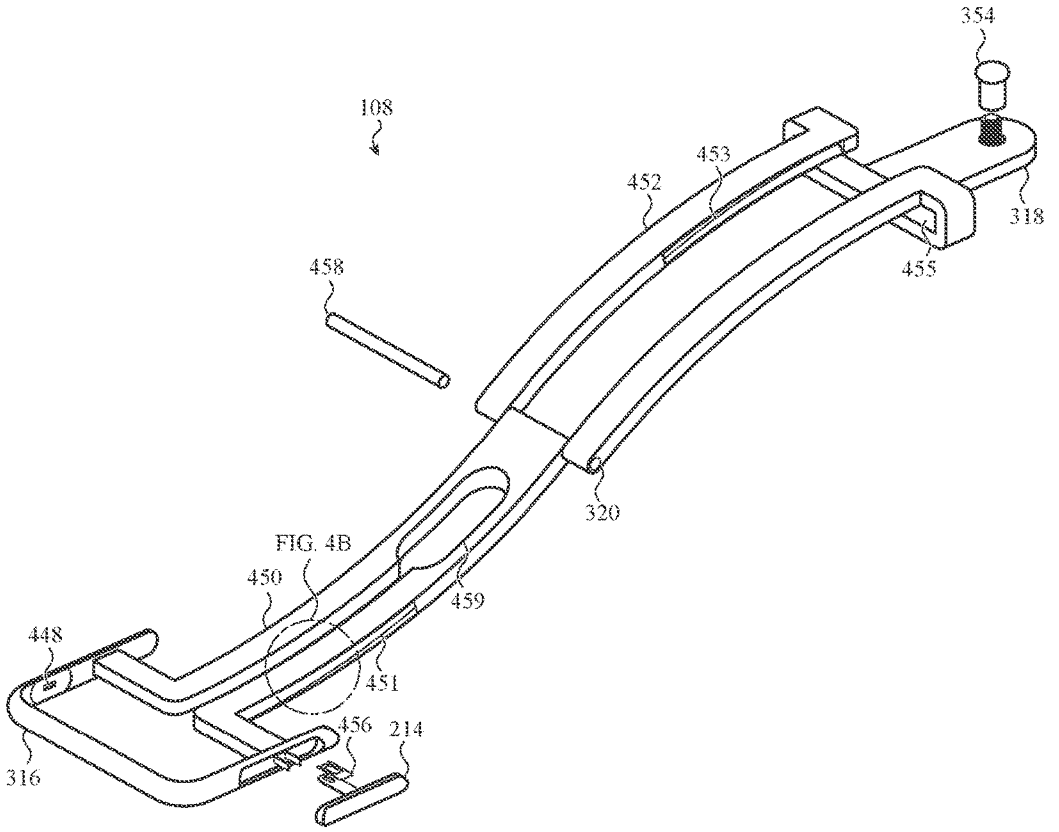
FIG. 4A depicts a clasp of the attachment strap, illustrating the clasp in an open configuration.

FIGS. 4A-6B depict the clasp 108 and its function. The clasp 108 includes two main components, a flexible linking portion 450 attached to a head band receiving portion 316, and a rigid linking portion 452 attached to a tail band receiving portion 318. The components are coupled together by a hinge, the hinge allowing the clasp to open (as illustrated in FIG. 4A) and close (as shown in FIG. 5A). The clasp 108 components have latching features 451, 453 (as further illustrated in FIGS. 6A and 6B) to retain the clasp 108 closed.

The clasp 108 is designed to close and open for attachment to and removal from an object, such as a wearer's wrist. While open, the wearable electronic device may be placed on a wearer's wrist. The head band may be fixed to the clasp 108 at the head band receiving portion 316, while the tail band is initially separated. A wearer may place the wearable electronic device on a wrist and thread the tail band into an opening 455 in the clasp 108. The wearer may adjust the length of the tail band for fit and comfort and secure the tail band to the clasp 108 at the tail band receiving portion 318. Once the tail band is secured, a wearer may close the clasp 108, securing the wearable electronic device to the wearer's wrist.

To remove the wearable electronic device, the wearer may press release buttons 214 in the clasp 108, which allow the clasp 108 to open by releasing the latching features 451, 453 of the clasp 108 components. Once the clasp 108 is open, the wearable electronic device may be removed from the wearer's wrist or adjusted. While open, the tail band may be removed from the clasp 108, while the head band may remain fixed to the clasp 108. In some embodiments, the head band may also be removed from the clasp 108 in the open configuration, e.g., for maintenance and/or replacement.

In many embodiments, the clasp 108 is curved. As the strap to which the clasp is attached may be worn on a curved surface (e.g., a wearer's wrist), the clasp 108 may be curved to better conform to the curved surface, which may further increase comfort and/or secure attachment of the strap and the wearable device.

FIG. 4A depicts the clasp 108 in an open configuration, with some parts exploded for illustrative purposes. The clasp 108 includes a head band receiving portion (e.g., a first band receiving portion) 316 and a flexible linking portion 450 coupled to a tail band receiving portion (e.g., a second band receiving portion) 318 and a rigid linking portion 452 by a hinge 320. The hinge 320 provides for the flexible linking portion 450 and the rigid linking portion 452 to pivot open and closed.

The clasp 108 can be formed from a variety of materials including metal or metal alloy (e.g., stainless steel, aluminum, and so on), precious metals (e.g., gold, silver, platinum, titanium, and so on), plastic, rubber, wood, silicone, glass, ceramic, fiber composite, or other suitable materials, or a combination of these materials. In some embodiments, the various parts of the clasp 108, such as the head band receiving portion 316, the flexible linking portion 450, the tail band receiving portion 318, and the rigid linking portion 452 may be formed from the same material. In other embodiments, some or all of the parts of the clasp 108 may be formed from different materials appropriate to the function of each part.

Turning in more detail to the flexible linking portion 450, at an end of the flexible linking portion 450 is a hinge 320, which couples to the rigid linking portion 452. The hinge 320 may have an opening through which a hinge pin 458 passes. The hinge pin 458 may be retained within the hinge 320 through a groove, undercut, screw, or other retention feature appropriate to retain the hinge pin 458 while allowing for motion of the hinge 320. The retention feature may be partially or entirely formed within the flexible linking portion 450, or it may be partially or entirely formed within the rigid linking portion 452.

The end of the flexible linking portion 450 forming a portion of the hinge 320 may be placed inside the rigid linking portion 452 such that the hinge pin 458 passes first through one arm of the rigid linking portion 452, through the flexible linking portion 450, then through a second arm of the rigid linking portion 452. The end of the flexible linking portion 450 forming a portion of the hinge 320 may be substantially a single piece, which may then split into two arms moving away from the hinge 320.

The flexible linking portion 450 may be shaped in a curve or arc along a portion of its length, or along its entire length. The curve or arc may have a radius which is suitable to assist the clasp 108 to conform to a wearer's wrist. In other embodiments, the flexible linking portion 450 may be formed in other shapes, such as flat, stepped, partially curved, bent, polygonal, or other geometric shapes (including non-regular shapes).

Along a portion of its length, the flexible linking portion 450 may be split into two parallel arms. Each arm may be formed with a latching feature 451 along at least a portion of its length. The latching feature 451 may facilitate a removable latch between the flexible linking portion 450 and the rigid linking portion 452 when the clasp 108 is closed.

The latching feature 451 may include one or more latching features suitable for forming a mechanical latch with the rigid linking portion 452, such as a tongue, a groove, a beveled edge, a step, an undercut, etc., or a combination of such features. The latching feature 451 may match with a corresponding latching feature 453 on the rigid linking portion 452 as discussed further below.

Figure 4B:
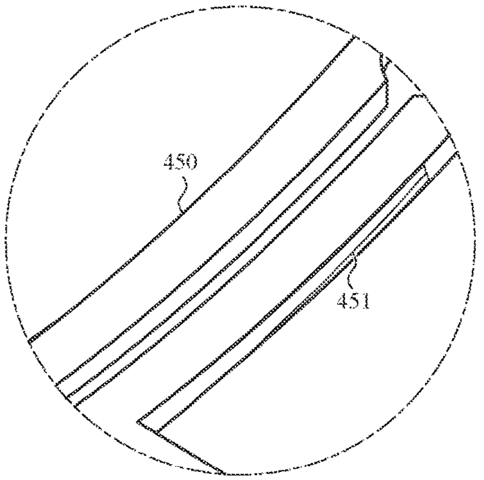
FIG. 4B depicts an enlarged view of a detail of the clasp.

The latching feature 451 may be tapered along each arm of the flexible linking portion 450. For example, where the latching feature 451 is a tongue, it may begin at a portion of the arm near the hinge 320 as a flat, smooth side. The flat, smooth side may gradually form a slope and/or protrusion moving toward the opposite end of the arm near the head band receiving portion 316. Thus portions of the latching feature 451 near the hinge 320 may barely be visually, tactilely, or otherwise perceptible as a latching feature, and only gradually may the latching feature 451 become more prominent while nearing the head band receiving portion 316. This is further illustrated in FIG. 4B, depicting an enlarged view of the latching feature 451.

This tapered latching feature 451 may result in a mechanical latch that is achieved gradually as the clasp 108 is closed. This may, for example, provide a smoother closing transition and/or require less exertion of force to close than a uniform latching feature. At the same time, the latching feature 451 may provide a strong latch due to its prominence at the end opposite the hinge 320. A cross-sectional view of the latching feature 451 is further illustrated below with respect to FIGS. 6A and 6B. In other embodiments, the latching feature 451 may be uniform along its length, or it may cover a larger or smaller portion of the flexible linking portion 450 arms.

The arms of the flexible linking portion 450 may operate as springs, allowing for deflection when a sufficient force is applied and returning to an original position once that force is released or sufficiently dissipated. The arms of the flexible linking portion may further provide a pre-load force when the clasp 108 is closed to retain the latching features 451, 453 engaged with one another. To this end, the arms of the flexible linking portion 450 may be at least partially flexible. The arms may be formed from a material which allows for flexure, and the arms may additionally or alternatively have a length and cross-section designed to allow for some deflection. In some embodiments, the flexible linking portion may include an opening 459 near the hinge 458 and near where the arms adjoin, to further impart a spring-like flexibility to the arms of the flexible linking portion. The arms of the flexible linking portion 450 may further be spaced apart to allow for inward deflection.

The arms of the flexible linking portion 450 may further be bent near the head band receiving portion 316 in order to couple to and/or provide a leverage point for applying force to deflect the arms. The arms may further attach to release buttons 214 where a user may apply force to cause the flexible linking portion 450 to flex inward. When the arms of the flexible linking portion 450 are flexed or deflected inward, the latching feature 451 may decouple from the corresponding latching feature 453 on the rigid linking portion 452 to allow the latch to open. The response of the flexible linking portion 450 to a force applied to the release buttons 214 is further illustrated below with respect to FIG. 5B.

The head band receiving portion 316 may be a rigid body to which the head band is coupled. The head band may be coupled by a spring pin, which may be retained within the head band receiving portion 316 by an attachment feature 448. Where the head band receiving portion 316 of the clasp 108 is rigid, it may be movably coupled to the flexible linking portion 450 to allow the flexible linking portion 450 to deflect inward while the head band receiving portion 316 retains its shape.

For example, the end of the flexible linking portion 450 which attaches to the head band receiving portion 316 may protrude into or partially through an opening. A release button 214 may attach to each end of the flexible linking portion 450 (e.g., on opposite sides of the head band receiving portion 450), and may be affixed by a suitable technique, such as a button snap 456, or other retention feature which will retain the release button 214 snugly against the end of the flexible linking portion 450 (e.g., an adhesive, screw, pin, etc.). In some embodiments, the button 214 and/or the end of the flexible linking portion 450 may include a retention feature to facilitate coupling to each other, and the button snap 456 may be fitted within the retention features to provide a one-way mechanical lock between the button 214 and the end of the flexible linking portion 450. With the release button 214 attached, the flexible linking portion 450 may be flexed inward, but its motion may be limited, such as by a groove through which the release button 214 may not pass.

In other embodiments, the head band receiving portion 316 may be partially flexible, and force may be applied directly to the head band receiving portion 316 in order to cause the flexible linking portion 450 to deflect inward. In some of these cases, the head band receiving portion 316 and the flexible linking portion 450 may be fixedly attached together, or formed of a single piece.

Turning to the rigid linking portion 452, an end of the rigid linking portion 452 couples to the flexible linking portion at the hinge 320. The hinge 320 may have an opening through which a hinge pin 458 passes. The hinge pin 458 may be retained within the hinge 320 through a groove, undercut, screw, or other retention feature appropriate to retain the hinge pin 458 while allowing for motion of the hinge 320. The retention feature may be partially or entirely formed within the flexible linking portion 450, or it may be partially or entirely formed within the rigid linking portion 452.

The end of the rigid linking portion 452 forming a portion of the hinge 320 may have two arms which surround the flexible linking portion 450 such that the hinge pin 458 passes first through one arm of the rigid linking portion 452, through the flexible linking portion 450, then through a second arm of the rigid linking portion 452.

The rigid linking portion 452 may be shaped in a curve or arc along a portion of its length, or along its entire length. The curve or arc may have a radius which is substantially the same as the radius of the flexible linking portion 450 such that the two portions line up with each other when the clasp 108 is closed. In other embodiments, the flexible linking portion 450 may be formed in other shapes, such as flat, stepped, partially curved, bent, polygonal, or other geometric shapes (including non-regular shapes). In some embodiments the shape of the rigid linking portion 452 may not match the shape of the flexible linking portion 450, and consequently they may latch together along a smaller portion of their lengths.

Along a portion of its length, the rigid linking portion 452 may be split into two parallel arms. Each arm may be formed with a latching feature 453 along at least a portion of its length. The latching feature 453 may be formed along a portion of the length of the rigid linking portion 452 which coincides with a latching feature 451 on the flexible linking portion 450. The latching feature 453 may facilitate a removable latch between the flexible linking portion 450 and the rigid linking portion 452 when the clasp 108 is closed.

The latching feature 453 may include one or more latching features suitable for forming a mechanical latch with the flexible linking portion 450, such as a tongue, a groove, a beveled edge, a step, an undercut, etc., or a combination of such features. The latching feature 453 may match with a corresponding latching feature 451 on the flexible linking portion 450. For example, the rigid linking portion 452 may have a groove as its latching feature 453, while the flexible linking portion 450 has a matching tongue for its latching feature 451, or vice versa. In other embodiments only one of the latching features 451, 453 may be required, or other types of latching features 451, 453 may be used.

As with the flexible linking portion 450, the latching feature 453 may be tapered along each arm of the rigid linking portion 452. For example, where the latching feature 453 is a groove, it may begin at a portion of the arm near the hinge 320 as a flat, smooth side. The flat, smooth side may gradually form a shallow recess moving toward the opposite end of the arm, becoming a deeper groove near the tail band receiving portion 318. Thus portions of the latching feature 453 near the hinge 320 may barely be visually, tactilely, or otherwise perceptible as a latching feature, and only gradually may the latching feature 453 become deeper while nearing the tail band receiving portion 318.

As discussed above, this tapered latching feature 453 may result in a mechanical latch that is achieved gradually as the clasp 108 is closed. This may, for example, provide a smoother closing transition and/or require less exertion of force to close than a uniform latching feature 453. At the same time, the latching feature 453 may provide a strong latch due to its depth at the end opposite the hinge 320. A cross-sectional view of the latching feature 453 is further illustrated below with respect to FIGS. 6A and 6B. In other embodiments, the latching feature 453 may be uniform along its length, or it may cover a larger or smaller portion of the rigid linking portion 452 arms.

The arms of the rigid linking portion 452 may be substantially rigid. The arms may be formed from the same material as the flexible linking portion 450 but with a more rigid cross-section and/or design, or the arms may be formed from a more rigid material. The spring-like flexible linking portion 450 may flex inward in order to move between the arms of the rigid linking portion 452 when closed. While closed, tension from the spring-like arms of the flexible linking portion 450 and/or the latching features 451, 453 may retain the flexible linking portion 450 between the arms of the rigid linking portion 452. The flexible linking portion 450 may also flex inward in order to disengage the latching features 451, 453 and open the clasp 108.

The rigid linking portion 452 may be attached to the tail band receiving portion 318. The tail band receiving portion 318 and the rigid linking portion 452 may be formed as separate components coupled together or they may be formed as a single component. The tail band receiving portion 318 may include an attachment feature 354 and a slot or opening 455 to facilitate attachment of the tail band to the clasp 108.

The attachment feature 354 of the tail band receiving portion 318 may be a post, as illustrated in FIG. 4A. The post 354 may include a flared head or similar feature to attach the tail band to the clasp, e.g., by passing the post through an opening which may be somewhat smaller than the flared head of the post 354. The post 354 may be internally threaded, and may be attached to a corresponding bolt, screw, or threaded post attached to or formed on the tail band receiving portion 318. In other embodiments, the post 354 may be spot-welded, formed integral to, molded onto, adhered to, or otherwise attached to the tail band receiving portion 318.

The tail band may have one or a series of openings through which the post 354 passes. When a wearer attaches a tail band to the clasp, an end of the tail band may pass through the slot, and the wearer may tighten the band a desirable amount, then place an opening in the band through the post 354. In other embodiments, different attachment features may attach the tail band to the tail band receiving portion 318, such as a magnet, buckle, loop, etc.

Figure 5A:
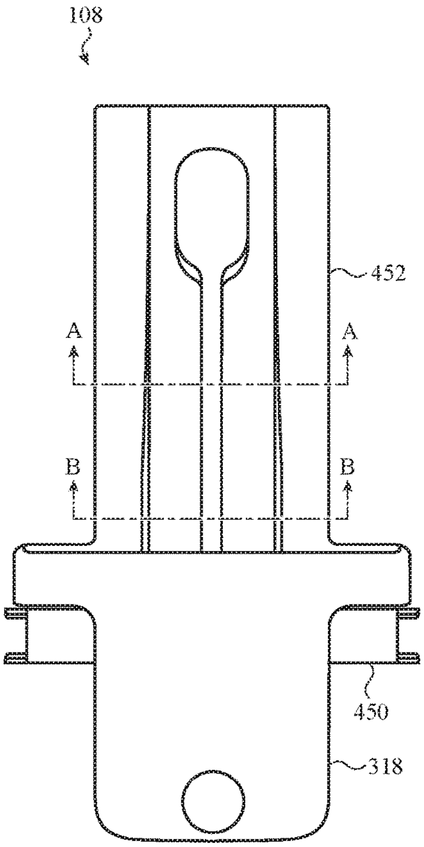
FIG. 5A depicts the clasp in a closed configuration.
Figure 5B:
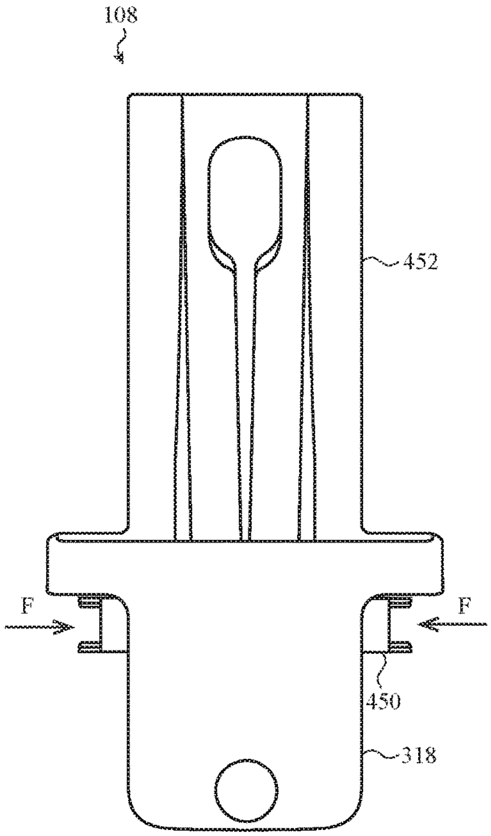
FIG. 5B depicts the clasp in a closed configuration, illustrating a force applied to a flexible linking portion of the clasp to open the clasp.

FIGS. 5A and 5B illustrate the clasp 108 when closed. FIG. 5A shows the clasp with the rigid linking portion 450 and the flexible linking portion 452 latched together, while FIG. 5B illustrates the response of the flexible linking portion 450 to a force applied to the release buttons illustrated in FIG. 4A. The force applied to the flexible linking portion 450 causes it to deflect inward and away from the rigid linking portion 452, allowing the clasp 108 to unlatch and open.

FIG. 5A depicts the clasp 108 in a closed configuration. The clasp 108 as depicted includes a tail band receiving portion 318 attached to a rigid linking portion 452. The rigid linking portion 452 surrounds a flexible linking portion 450 while the latch 108 is closed. The flexible linking portion 450 and the rigid linking portion 452 may include latching features, as illustrated with respect to FIGS. 6A and 6B. The latching features may operate to retain the clasp 108 closed. As shown, while the clasp 108 is closed the latching features may not be visible.

In order to open the clasp, force F may be applied to the flexible linking portion 450, as depicted in FIG. 5B. As depicted, force F is applied to ends of the flexible linking portion 450, which may attach to buttons (such as release button 214 depicted above with respect to FIG. 4A, omitted from FIGS. 5A and 5B for clarity). When force F is applied to the ends of the flexible linking portion 450, the arms of the flexible linking portion 450 deflect or flex inwardly and away from the rigid linking portion 452. This may cause the latching feature of the flexible linking portion 450 (illustrated below with respect to FIGS. 6A and 6B) to decouple from the latching feature of the rigid linking portion. With the latching features decoupled, the clasp 108 may be opened by rotating the flexible linking portion 450 and the rigid linking portion 452 apart at their respective ends opposite the hinge 320.

In some embodiments the flexible linking portion 450 may instead surround the rigid linking portion 452. In such an embodiment force may instead be applied to the flexible linking portion 450 to deflect it outward and away from the flexible linking portion 450. In other embodiments, the rigid linking portion 452 may only partially surround the flexible linking portion 450, and the clasp 452 may therefore latch along a smaller portion than shown in FIGS. 5A and 5B.

Figure 6A:
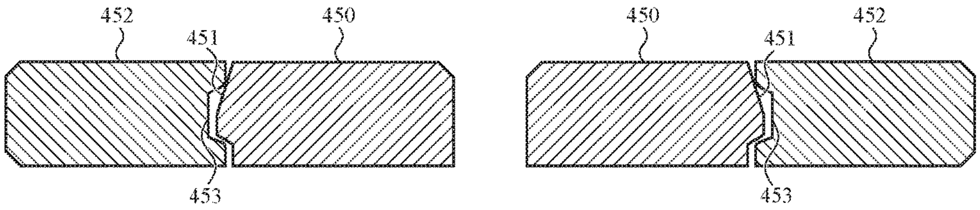
FIG. 6A depicts a cross-section of the clasp, illustrating attachment features of the clasp.
Figure 6B:
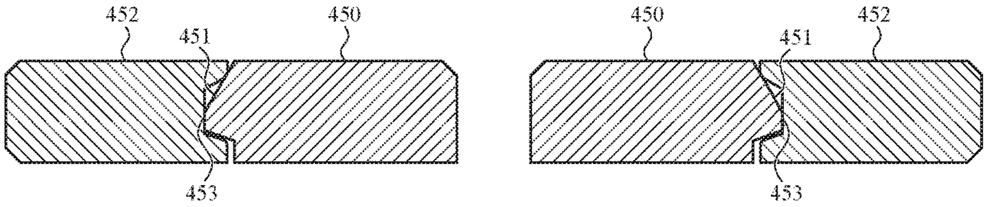
FIG. 6B depicts another cross-section of the clasp, illustrating attachment features of the clasp.

FIGS. 6A and 6B depict cross sections of the clasp illustrated in FIG. 5A, taken along lines A-A and B-B respectively. The clasp includes a flexible linking portion 450 surrounded by a rigid linking portion 452. The flexible linking portion 450 includes a latching portion 451, here depicted as an angled tongue. The rigid linking portion 452 includes a corresponding latching feature 453, here depicted as a groove. The tongue-and-groove of the latching features 451, 453 retains the clasp in a closed configuration until the flexible linking portion is deflected, allowing the latching features 451, 453 to separate.

As depicted in FIGS. 6A and 6B, the latching feature 451 on the flexible linking portion 450 may be tapered along the length of the flexible linking portion 450. FIG. 6A depicts a cross-section of the latch taken along line A-A, where the latching feature 451 on the flexible linking portion 450 is shallow. Moving toward line B-B, the latching feature 451 on the flexible linking portion 450 becomes deeper, resulting in a stronger latch at the critical load point opposite the hinge. The groove may be similarly tapered along the length of the rigid linking portion 452.

Design and Components of the Head Band

Returning to FIG. 3, the clasp 108 attaches to a head band 104 at a head band receiving portion 316. The head band 104 may be attached by a spring pin 321. In order to achieve a thinner head band 104 and clasp 108, the spring pin 321 may pass through an opening in the head band 104 while the head band 104 maintains a uniform thickness.

To maintain a low profile, the head band 104 may contain an insert 726 as depicted in FIGS. 7-9F. The insert 726 may be rigid, and may serve as a structure through which the spring pin 321 attaching the head band 104 to the clasp 108 passes. The rigid insert 726 may also add structural rigidity to the head band 104 to improve its function and/or durability.

Figure 7:
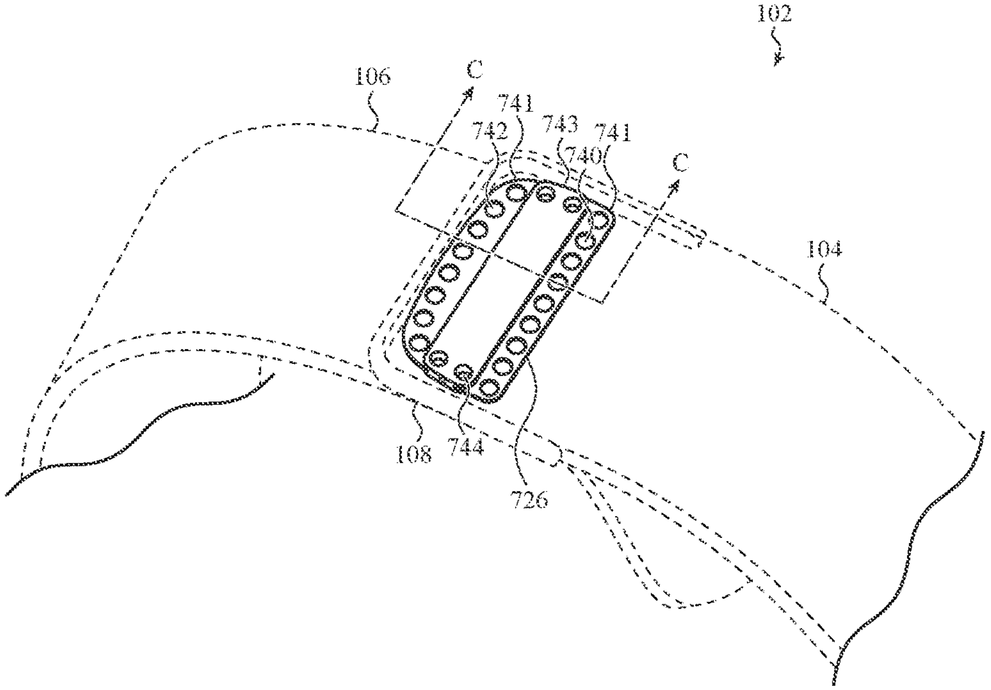
FIG. 7 depicts a transparent view of the attachment strap.

FIG. 7 depicts a transparent view of the attachment strap 102. The head band 108 attaches to a clasp 108 by a spring pin. The end of the head band 108 attaching to the clasp 108 may be reinforced with a rigid insert 726 within the band, and the spring pin may pass through the rigid insert 726 (the opening for the spring pin is further illustrated below with respect to FIG. 8).

The rigid insert 726 may be formed from a variety of suitable substantially rigid materials. Example materials include metal or metal alloy (e.g., stainless steel, aluminum, and so on), plastic, silicone, glass, ceramic, fiber composite, or other suitable materials, or a combination of these materials. The rigid insert 726 may include a thick base 743 adjoined by thin flanges 741. The rigid insert 726 may be formed as a single piece, or it may be formed from multiple pieces bonded together (e.g., through welding, an adhesive, mechanical attachment, etc.).

A spring pin may pass through the base 743, and the base 743 may be thicker than the flanges 741 to facilitate retaining and/or supporting the spring pin. The flanges 741 may be thin in order to facilitate attachment to other components of the head band 104. For example, one or more fillers may be bonded to one or both flanges 741 (as illustrated further below with respect to FIG. 8), and the thin profile of the flanges 741 may act as a shelf for bonding. Once bonded, there may be a substantially uniform surface across the filler and the base 743.

The flanges 741 may further include attachment features 740, which may be any attachment feature suitable for promoting bonding between the rigid insert 726 and other components of the head band 104. For illustrative purposes the attachment features 740 are here depicted as holes through the flanges 741, which may be filled, e.g., with a portion of a molded filler to strengthen the bond between the filler and the rigid insert 726. In other embodiments, the attachment features 740 may be beveled edges, undercuts, a roughened surface, divots, etc., or a combination of such features used to promote bonding between the rigid insert 726 and surrounding components of the head band 104.

The rigid insert 726 may similarly include dual purpose holes 742 and/or stitching holes 744, which may also promote bonding between the rigid insert 726 and other components of the head band 104. The attachment features 740, dual purpose holes 742, and stitching holes 744 may be formed during formation of the rigid insert 726, or they may be formed in a separate process. The attachment features 740, dual purpose holes 742, and stitching holes 744 are further discussed below with respect to FIGS. 9A-9F.

In some embodiments, the rigid insert 726 may be a uniform size in the place of the thick base 743 and thin flanges 741, or it may only include one flange 741. Additionally or alternatively, the attachment features 740, dual purpose holes 742, and/or stitching holes 744, or a portion thereof, may be omitted.

Figure 8:
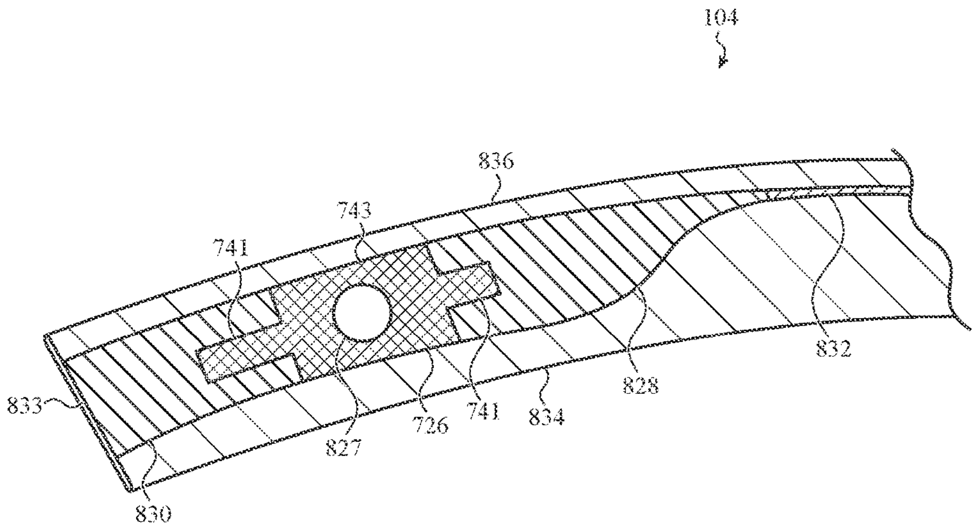
FIG. 8 depicts a cross-sectional view of a head band shown in FIG. 7.

FIG. 8 depicts a cross-sectional view of the head band 104 shown in FIG. 7, taken along line C-C, showing the rigid insert 726 within the band. As depicted in FIG. 7, the rigid insert 726 may be placed at an end of the head band 104 which attaches to the clasp. The rigid insert 726 may include an opening 827 within the base 743 to house a spring pin (not shown) which attaches to the clasp.

A filler, such as a polymer filler 828 may be bonded to the rigid insert 726 on a flange 741 of the rigid insert 726 opposite the end of the head band 104. The filler 828 may be made from a polymer to facilitate bonding between the filler 828 and the rigid insert 726. For example, a polymer filler 828 may be readily and cost-effectively injection molded to the rigid insert 726, where other filler materials may be more expensive or difficult to mold. The polymer filler 828 may also be more flexible than the rigid insert 726 while maintaining a strong bond to it. The polymer filler 828 may be formed from a suitable material, such as polyurethane, polyvinylchloride, rubber, or fluoroelastomer.

The polymer filler 828 may be bonded to the rigid insert 726 by a suitable method, such as injection molding. The flange 741 of the rigid insert 726 may act as a shelf which increases the surface area of the bond between the polymer filler 828 and the rigid insert 726, as well as strengthening the mechanical bond between the two as the polymer filler 828 partially surrounds the rigid insert 726. Referring to FIG. 7, when the polymer filler 828 is injection molded to the rigid insert 726, it may fill the attachment features 742 in order to further enhance the bond between the polymer filler 828 and the rigid insert 726.

Another filler material 830, which may be a similar material to the polymer filler 828, may be bonded to an end of the rigid insert 726 adjacent the end of the head band 104. The end of the head band 104 may be covered with a paint 833, or similar cover layer, which may block the filler material 830 from view and/or seal the layers of the head band 104. Other embodiments may omit the filler material 830 and/or paint 833 from the end of the head band 104.

As depicted, the polymer filler 828 may be formed in a curved shape which may match a curved shape of the clasp. This may give the head band 104 a pre-curved end that substantially conforms to the clasp when the clasp is closed. The polymer filler 828 may also have a cross section which may taper from the end of the polymer filler 828 bonded to the rigid insert 726.

The tapered end of the polymer filler 828 may be placed adjacent to a core layer 832. The core layer 832 may be a filler layer of the head band 104. The tapered shape of the polymer filler 828, along with the core layer 832, may facilitate a uniform thickness to the head band 104 without noticeable bumps, depressions, or changes in the pliability of the head band 104. The core layer 832 may further strengthen the head band. The core layer 832 may be formed from woven fabric (e.g., natural or synthetic fabric), polymer (e.g., silicone, thermoplastic polyurethane (TPU), polyvinylchloride, rubber, or fluoroelastomer), leather, metal, mesh, links and/or the like. The core layer 832 may be bonded to the polymer filler 828, using an adhesive or other bonding agent, or the core layer 832 may not be bonded to the polymer filler 828.

A first outer layer 834 and a second outer layer 836 may enclose the filler material 830, the rigid insert 726, the polymer filler 828, and the core layer 832. The outer layers 834, 836 may be formed from woven fabric (e.g., natural or synthetic fabric), polymer (e.g., silicone, thermoplastic polyurethane (TPU), polyvinylchloride, rubber, or fluoroelastomer), leather, metal, mesh, links and/or the like. The first outer layer 834 and the second outer layer 836 may be formed from the same material as the core layer 832 or from different materials. The outer layers 834, 836 may generally be formed from the same material, but in some embodiments the first outer layer 834 may be formed from a different material than the second outer layer 836.

The first outer layer 834 may be formed, cut, or otherwise shaped with a tapered cross-section to match the tapered cross-section of the polymer filler 828, resulting in the head band 104 having a substantially uniform thickness. The second outer layer 836 may have a uniform thickness, or it may also be tapered in a similar fashion to the first outer layer 834. Tapering the first outer layer 834 and the polymer filler 828 may reduce the size of the core layer 832 and/or facilitate manufacturing of the head band 104 (e.g., by eliminating the need for the polymer filler to extend the length of the head band 104). The head band 104 may contain further layers, such as adhesive layers, as further illustrated in FIG. 12.

In some embodiments, the first outer layer 834 and/or second outer layer 836 may further be formed in a curved shape to match the curved shape of the polymer filler. The outer layers 834, 836 may be formed in a curved shape by cutting, treating, mechanically pre-curving, or similar appropriate methods.

In some embodiments, the core layer 832 and/or polymer filler 828 may be omitted from the head band 104. For example, the polymer filler 828 may be tapered such that the first outer layer 834 and the second outer layer 836 may be bonded directly together without a core layer 832 past the polymer filler 828. Alternatively, the polymer filler 828 may extend the length of the head band 104. In other examples, both may be omitted, e.g., where the first outer layer 534 and or second outer layer 836 is a moldable material (e.g., fluoroelastomer) which may be directly bonded to the rigid insert 726.

Figure 9A:
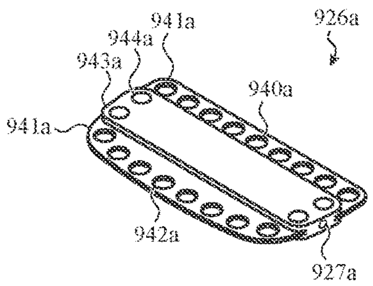
FIG. 9A depicts a first example rigid insert.
Figure 9C:
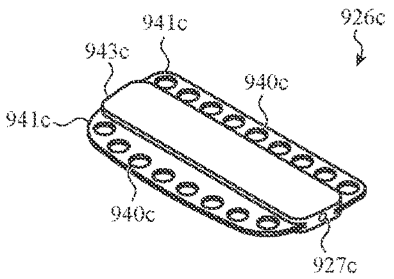
FIG. 9C depicts a second example rigid insert.
Figure 9B:
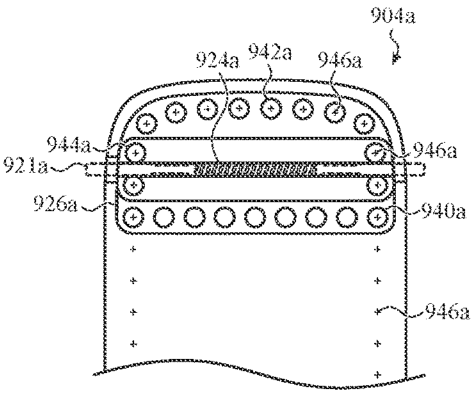
FIG. 9B depicts attachment of the first example rigid insert to the head band.
Figure 9D:
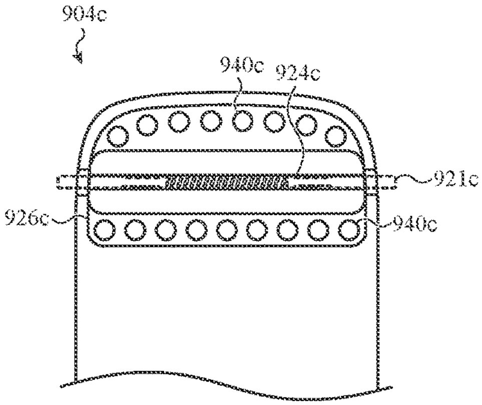
FIG. 9D depicts attachment of the second example rigid insert to the head band.
Figure 9E:
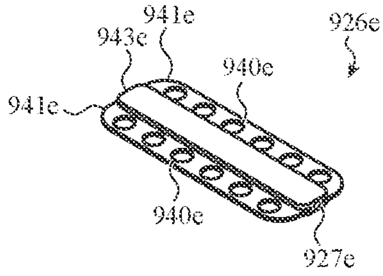
FIG. 9E depicts a third example rigid insert.
Figure 9F:
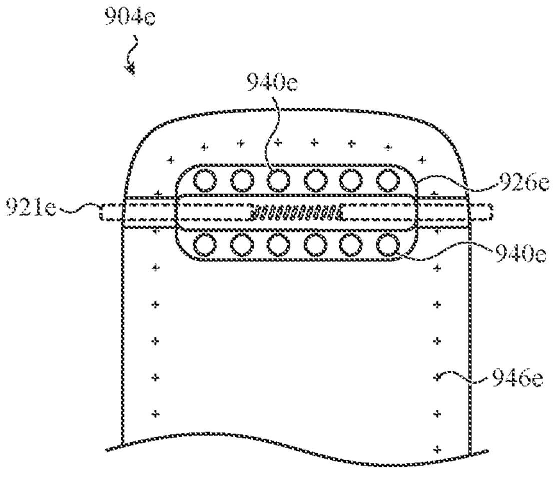
FIG. 9F depicts attachment of the third example rigid insert to the head band.

FIGS. 9A-9F depict example rigid inserts 926*a*, 926*b*, 926*c* and attachment of the same to the head band 904*a*, 904*b*, 904*c*. FIGS. 9A, 9C, and 9E depict example embodiments of the rigid insert 926*a*, 926*b*, 926*c*, while FIGS. 9B, 9D, and 9F depict transparent views of head bands 904*a*, 904*b*, 904*c* to illustrate placement of the rigid inserts 926*a*, 926*b*, 926*c* within the head bands 904*a*, 904*b*, 904*c* respectively.

FIGS. 9A and 9B depict an example rigid insert 926*a*, which may be placed in a head band 904*a*. As discussed above with respect to FIG. 7, the rigid insert 926*a* may have a thick base 943*a* which may include an opening 927*a* for a spring pin 921*a*, 924*a*. The rigid insert 926*a* may further include thin flanges 941*a* to which a polymer filler is bonded, as illustrated with respect to FIG. 8.

In some examples, the rigid insert 926*a* may function as an outer casing for the spring pin, taking the place of a traditional outer casing to control the compression of the spring 924*a* and retain the spring 924*a* and pins 921*a*. Accordingly, the spring pin may be formed by placing a spring 924*a* (e.g., a helical or other appropriate spring) within the opening 927*a* in the rigid insert 926*a*, and pins 921*a* at ends of the opening 927*a* abutting the spring. The opening 927*a* may be formed in an appropriate shape, such as a cylinder, and may additionally have retention features to retain the spring 924*a* and/or pins 921*a*.

One or both flanges 941*a* of the rigid insert 926*a* may include attachment features 940*a*, which may be formed as holes through the flange 941*a*. While FIGS. 9A and 9B depict the attachment features 940*a* as rounded holes, they may take other forms such as oval, square, rectangular, or other geometric shapes (including non-regular shapes). The attachment features 940*a* may further be filled with a polymer filler (e.g., the polymer filler 828 of FIG. 8) to enhance the filler's bond with the rigid insert 926*a*.

The base 943*a* may include stitching holes 944*a*. The stitching holes 944*a* may be formed to pass through the base 943*a* around the spring pin 921*a* opening 927*a*. Once the rigid insert 926*a* is placed within the head band 904*a*, the outer layers of the head band 904*a* may be joined together with stitching 946*a* (here schematically represented). The stitching 946*a* may enhance bonding of the head band 904*a* components and/or layers, and may additionally or alternatively be aesthetically pleasing. The stitching 946*a* may be formed from any suitable material (e.g., thread, yarn, rivets, etc.), and may pass through the stitching holes 944*a* of the base 943*a*, enhancing attachment of the rigid insert 926*a* to the outer layers of the head band 904*a* and/or fixing its location within the head band 904*a*.

One or both flanges 941*a* may also include dual-purpose holes 942*a*. Stitching 946*a* may pass through the dual purpose holes 942*a*, and the dual purpose holes 942*a* may additionally or alternatively be filled with a polymer filler to enhance its bond with the rigid insert 926*a*.

FIGS. 9C and 9D depict another example rigid insert 926*c*, which may omit stitching holes in the base 943*c*. Without stitching holes in the base 943*c*, the head band 904*c* may be bonded together without stitching between the outer layers. In other embodiments, the outer layers may be stitched together but omit the end of the band with the rigid insert 926*c*.

The rigid insert 926*c* may also include flanges 941*c* with attachment features 940*c*, similar to those described above with respect to FIGS. 9A and 9B. An opening 927*c* for a spring pin 921*c*, 924*c* may be provided through the base 943*c* for attaching the head band 904*c* to a clasp.

FIGS. 9E and 9F depict another example rigid insert 926*e*. The rigid insert 926*e* may be smaller than the previous rigid inserts, and may be placed in a head band 904*e* that is bonded together with stitching 946*e* between the outer layers that passes around the rigid insert 926*e*. Similar to the rigid insert depicted in FIGS. 9A and 9B, the rigid insert 926*e* may include a base 943*e* with an opening 927*e* for a spring pin 921*e*, 924*e* for attaching the head band 904*e* to a clasp. The rigid insert 926*e* may also include flanges 941*e* adjoining the base 943*e* that include attachment features 940*e*.

Attachment of the Head Band to the Clasp

The head band depicted above with respect to FIGS. 7-9F may be attached to the clasp 108 through use of a spring pin 321. The spring pin 321 may pass through a rigid insert in the head band, such as the rigid inserts depicted in FIGS. 9A-F. The clasp 108 may include a U-shaped head band receiving portion 316 to surround the head band. The head band receiving portion 316 may have an attachment feature 448 to retain the head band. In some embodiments, the attachment feature 448 may also facilitate removal of the head band, with or without special tools. In some embodiments, a tail band receiving portion may additionally or alternatively include these features.

Figure 10A:
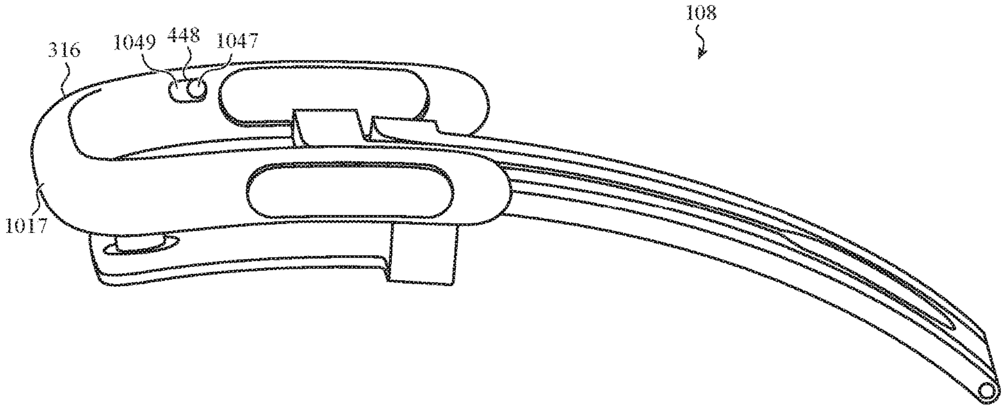
FIG. 10A depicts the clasp, illustrating features for attaching to the head band.
Figure 10B:
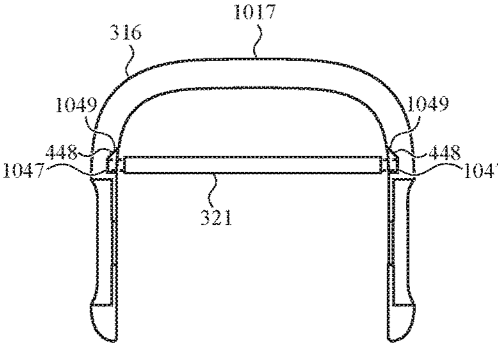
FIG. 10B depicts a partial top view of the clasp depicted in FIG. 10A.
Figure 10C:
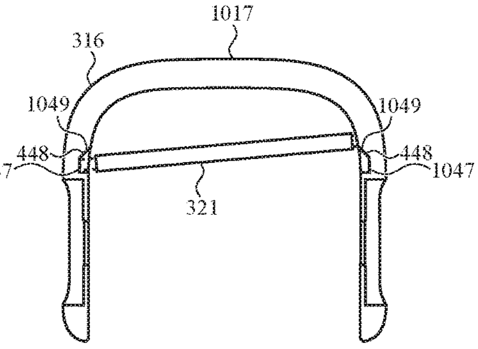
FIG. 10C depicts another partial top view of the clasp depicted in FIG. 10B.

As depicted in FIGS. 10A-10C, the attachment feature 448 may include a stepped recess 1047 and a ramp 1049. The stepped recess 1047 may have rounded walls, or it may have squared walls, or another suitable geometric shape. The stepped recess 1047 may be shaped to mate with the spring pin (e.g., rounded walls to mate with a rounded pin), or it may have an arbitrary shape. The stepped recess 1047 may be stepped on three sides, and may adjoin the ramp 1049 on a fourth side. The ramp 1049 may be placed on the side of the stepped recess 1047 nearest the bottom of the "U" 1017 of the head band receiving portion 316.

The ramp 1049 may facilitate removal of the spring pin without special tools. The head band receiving portion 316 may include a pair of attachment features 448 on opposite sides of an interior surface. Each attachment feature 448 may have a stepped recess 1047 with a ramp 1049 on a side of the recess 1047 near the bottom of the "U" 1017 of the head band receiving portion 316. The stepped sides of the recess 1047 may normally retain the spring pin 321 within the recess 1047 when the clasp 108 is closed, as the head band would not be able to move toward the bottom of the "U" 1017 of the head band receiving portion 316. The stepped sides of the recess 1047 would prevent the spring pin 321 from being disengaged from the recess 1047 in any other direction.

However, with the clasp 108 open, the head band may be able to rotate such that the head band could be moved toward the bottom of the "U" 1017. From this position, a wearer or servicer may apply a force to the head band and/or spring pin 321 (e.g., near an end of the spring pin 321) along a direction toward the bottom of the "U" 1017. As illustrated in FIG. 10C, the ramp 1049 would translate a portion of the moving force to compress the spring pin, allowing the spring pin to move out from the stepped recess 1047.

In other embodiments, the head band receiving portion 316 may have different attachment features 448. For example, the attachment feature 448 may contain only a stepped recess 448 and omit the ramp 1049, which may require special tools for removal. Other attachment features 448 may be used which are suitable to retain a spring pin 321 within the head band receiving portion 316.

Example Spring Pins

The head band includes a spring pin, which may attach the head band to a clasp as depicted in FIGS. 10A-10C. The spring pin may pass through the rigid insert of the head band, such as the example rigid insert illustrated above with respect to FIGS. 9A-9F. The rigid insert may provide an opening which retains the spring pin, and may additionally provide a rigid structure to prevent the spring pin from bending. The rigid insert may thus take the place of prior art casings around watch band spring pins.

Figure 11A:
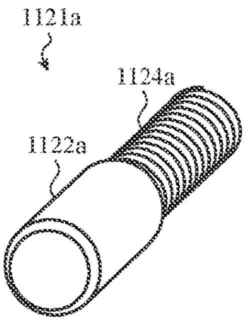
FIG. 11A depicts an example spring pin having a round cross-section.
Figure 11B:
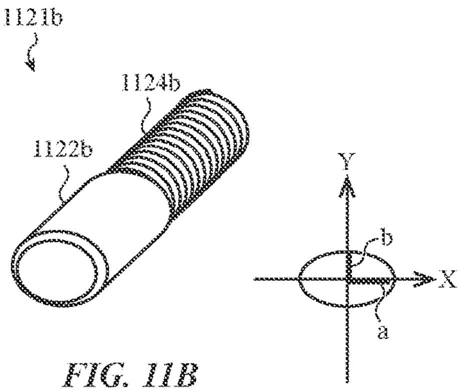
FIG. 11B depicts an example spring pin having an elliptical cross-section.
Figure 11C:
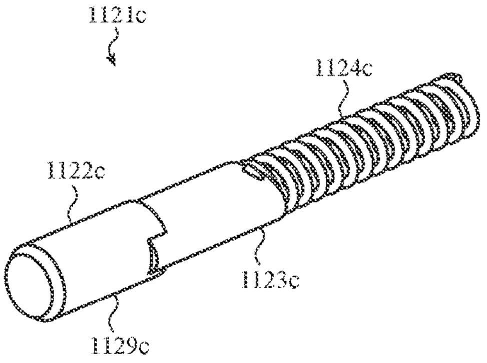
FIG. 11C depicts an example spring pin having a complex cross-section.
Figure 11D:
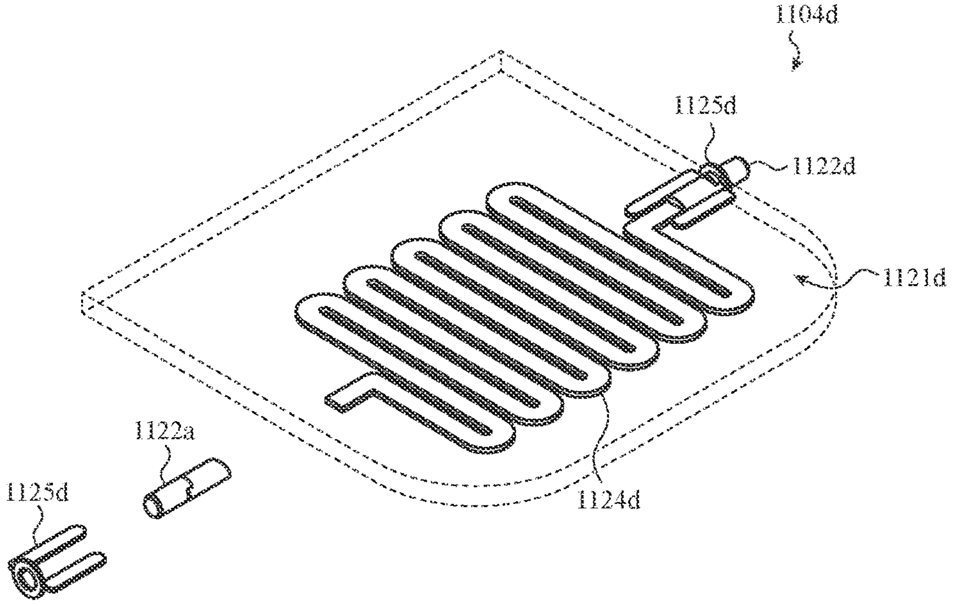
FIG. 11D depicts an alternative spring pin having a serpentine spring.
Figure 11E:
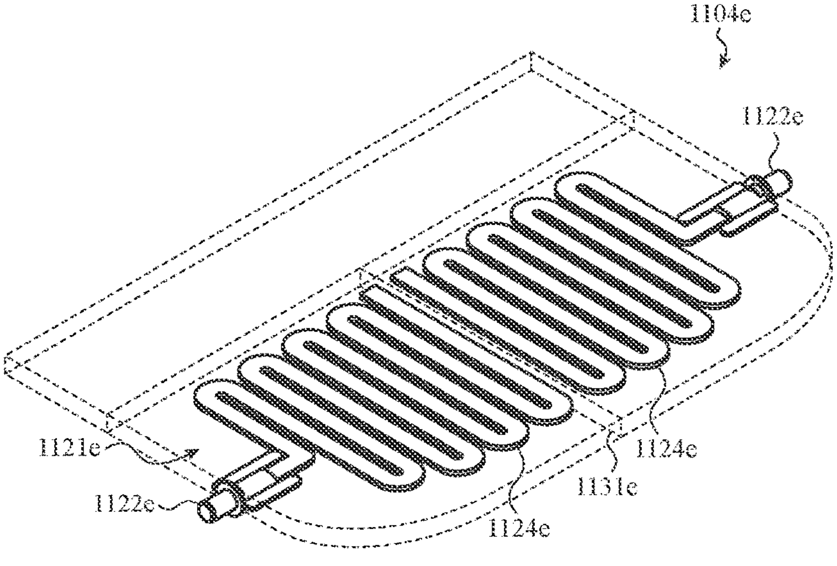
FIG. 11E depicts another alternative spring pin having a serpentine spring.

In some embodiments, the spring pin may be designed with a low profile in order to provide the head band with a low profile (e.g., thinner cross-section) than prior art bands, particularly when coupled with the features illustrated above with respect to FIGS. 7-9F. Examples of spring pins 1121*a*, 1121*b*, 1121*c* for use in a rigid insert are depicted in FIGS. 11A-11C. FIGS. 11D and 11E depict alternative example spring pins 1121*d*, 1121*e* which may be implemented in the head band with or without a rigid insert.

FIG. 11A depicts an example spring pin 1121*a* which may be inserted through a rigid insert in the head band. The spring pin 1121*a* includes a pin 1122*a* coupled to a helical spring 1124*a*. The pin 1122*a* has a circular cross section, which mates with an attachment feature (such as a recess) in the clasp of the attachment strap. The helical spring 1124*a* operates to apply tension (e.g., a biasing force) to the pin 1122*a* to maintain attachment of the head band to the clasp.

FIG. 11B depicts another example spring pin 1121*b* which may be inserted through a rigid insert in the head band. The spring pin 1121*b* also includes a pin 1122*b* coupled to a helical spring 1124*b* (which provides a biasing force as described with respect to FIG. 11A). The pin 1122*b* has an elliptical cross section, which may increase the strength of the pin along a critical load path when it is held within an attachment feature of the clasp. For example, the critical load path may be along the x-axis (e.g., the direction which would pull the watch band away from the clasp). In such a case, the moment of inertia about the y-axis may be given as:

$$I_y = \frac{\pi}{4}a^3b$$

where a is equal to the radius of an ellipse along the x-axis and b is equal to the radius of the ellipse along the y-axis. Thus, if the pin 1122*b* has the same height as the pin 1122*a* in FIG. 11A, it will be stronger along the critical load path along the x-axis (i.e., about the y-axis) corresponding to the long side of its elliptical cross-section. In some embodiments, the height of the pin 1122*b* may also be reduced, while the elliptical cross-section maintains equal strength to the embodiment of FIG. 11A along the critical load path.

FIG. 11C depicts another example spring pin 1121*c* which may be inserted through a rigid insert in the head band. The spring pin 1121*c* likewise includes a pin 1122*c* coupled to a helical spring 1124*c* (which provides a biasing force as described with respect to FIG. 11A). The pin 1122*c* has a complex cross section, with an inner elliptical portion 1123*c* and an outer circular portion 1129*c*. The inner portion 1123*c* may pass through the head band, and its elliptical cross section may provide the pin 1121*c* with strength along the critical load path while allowing for a lower profile, thinner head band, as described above with respect to FIG. 11B. The outer portion 1129*c* may remain outside the head band, and its circular cross section may better mate with an attachment feature of the clasp and/or may allow for easier servicing.

FIG. 11D depicts an alternative spring pin 1121*d* which may be utilized with a head band 1104*d* either with or without a rigid insert. The spring pin 1121*d* includes a pair of pins 1122*d* coupled to a flat spring 1124*d* having a planar serpentine shape. The pins 1122*d* are also coupled to the head band 1104*d* by a suitable retaining technique, such as bushing inserts 1125*d*. The flat spring 1124*d* is enclosed by the head band 1104*d* (or a rigid insert shaped to accommodate the flat spring 1124*d*) and applies tension to the pins 1122*d*. When the pins 1122*d* are pressed inward (e.g., when mated to a recess in the clasp), the serpentine coils are compressed along the plane of the spring, resulting in an opposing tension force being applied to the pins 1122*d*, which operates as a biasing force to maintain attachment of the head band to the clasp.

Due to the planar compression of the flat spring 1124*d*, it may have a lower profile than the helical springs of FIGS. 11A-11C, which may facilitate reduced thickness in the head band 1104*d*. The head band 1104*d* may be further thinned by coupling the flat spring 1124*d* with pins 1122*d* having at least a partially elliptical cross section. The head band 1104*d* may also be more flexible than implementations with the rigid insert.

FIG. 11E depicts another alternative spring pin 1121*e*, which may have features similar to FIG. 11D. The spring pin 1121*e* depicted includes a pair of pins 1122*e* coupled to a pair of flat springs 1124*e*, each having a planar serpentine shape. The flat springs 1124*e* are enclosed by the head band 1104*e* and may rest in chambers separated by a wall 1131*e*. In some embodiments, the flat springs 1124*e* are additionally or alternatively enclosed by a rigid insert shaped to accommodate the flat springs 1124*e*. The wall 1131*e* is substantially rigid, such that when force is applied to a pin 1122*e*, the wall 1131*e* may maintain its position and cause the applied force to compress the flat spring 1124*e* (to provide a biasing force similar to FIG. 11D). The wall 1141*e* may be formed from a material common to the head band. The wall 1141*e* material may be selected to provide sufficient rigidity, or the wall 1141*e* may be sufficiently thick to be rigid.

Example Band Assembly Layers and Method

Figure 12:
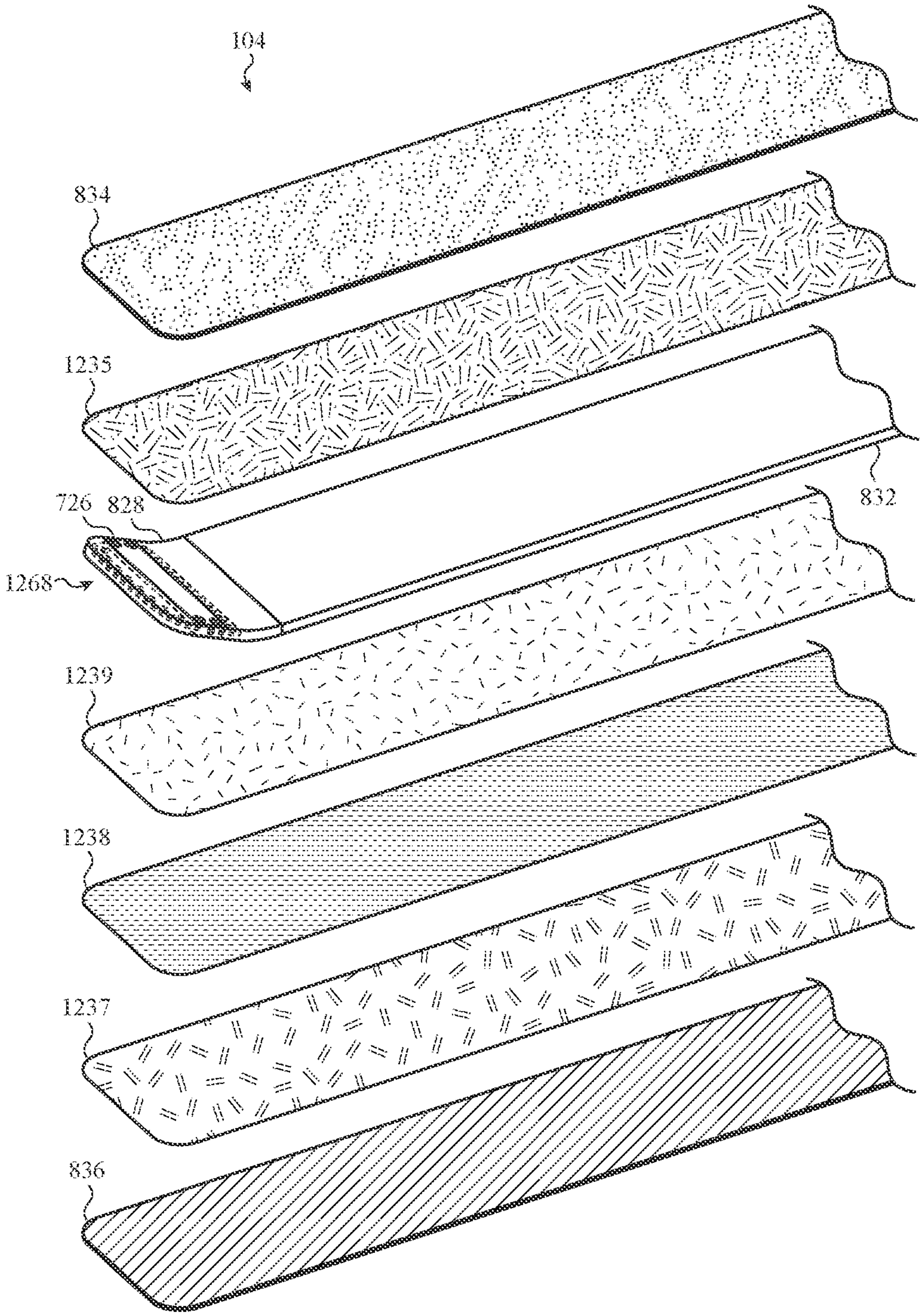
FIG. 12 depicts an exploded view of an example head band, illustrating various layers within the head band.

FIG. 12 depicts an exploded view of an example head band 104, illustrating various layers within the head band 104. The exploded view of FIG. 12 is a rotated view with respect to FIGS. 3A, 7, and 8; it is oriented similar to FIG. 3B. An insert layer 1268 may include a rigid insert 726 coupled to a polymer filler 828. The polymer filler 828 may be placed adjacent to or coupled to a core layer 832, as described above with respect to FIG. 8.

The insert layer 1268 may be coupled to a number of other layers of the head band 104 as depicted in FIG. 12, including an inner adhesive layer 1239, a fiber layer 1238, first and second outer adhesive layers 1235, 1237, and first and second outer layers 834, 836. The polymer filler 828 may be molded in a curved shape (as shown). The remaining layers, while shown flat, may not be flat when the head band 104 is assembled (e.g., where they interact with the polymer filler 828 other layers may also be curved).

The head band 104 may be reinforced by a fiber layer 1238. In an exemplary embodiment, the fiber layer 1238 may be formed from Vectran®, which exhibits high strength and low elasticity. However, any suitable fiber may be used to reinforce the head band 104, including Kevlar (or other aramid or para-aramid fibers), xylow, nitinol, steel, or other natural, synthetic, and/or metallic fibers, or combinations of the above fibers.

An inner adhesive layer 1239 may bond the fiber layer 1238 to the insert layer 1268, including the rigid insert 726, polymer filler 828, and core layer 832. The inner adhesive layer 1239 can be any suitable material that promotes adhesion between the fiber layer 1238 and the components of the insert layer 1268 of the head band 104. According to some embodiments, the inner adhesive layer 1239 can include a thermoplastic adhesive. In other embodiments, however, any suitable adhesive, such as an epoxy or glue may be used.

The first outer layer 834 can form one of the outer surfaces of the head band 104, and may form an inner surface of the head band 104 to be placed adjacent to a wearer's skin. The material of the first outer layer 834 may be aesthetically appealing and/or comfortable when worn adjacent to a wearer's skin. Additionally or alternatively, the material of the first outer layer 834 may be resistant to skin oils, fluids, and/or environmental conditions. In some embodiments, the material of the first outer layer 834 may be absorbent or provide wicking action for moisture. In still other embodiments, the first outer layer 834 may be easily washable. The material of the first outer layer 834 may additionally or alternatively be selected for a particular coefficient of friction when touching a wearer's skin (e.g., to stay in place).

The first outer layer 834 may be bonded to the insert layer 1268 by a first outer adhesive layer 1235. The first outer adhesive layer 1235 can be any suitable material that promotes adhesion between the first outer layer 834 and the components of the insert layer 1268, such as a thermoplastic adhesive (e.g., the same or a different thermoplastic adhesive as in the inner adhesive layer 1239). In other embodiments, however, any suitable adhesive, such as an epoxy or glue may be used.

The second outer layer 836 can form an outer surface of the head band 104 opposite the first outer layer 834, and may be visible when worn. The second outer layer 836 may be formed from a suitable material (e.g., the same or a different material used in the first outer layer 834), as noted above with respect to FIG. 8. The material of the second outer layer 836 may be aesthetically appealing and/or durable. Additionally or alternatively, the material of the second outer layer 836 may be resistant to fluids and/or environmental conditions. In some embodiments, the second outer layer 836 may be easily washable. The material of the second outer layer may additionally or alternatively be selected for a particular coefficient of friction when touching a wearer's skin (e.g., to slide freely).

The second outer layer 836 may be bonded to the fiber layer 1238 by a second outer adhesive layer 1237. The second outer adhesive layer 1237 can be any suitable material that promotes adhesion between the second outer layer 836 and the fiber layer 1238, such as a thermoplastic adhesive (e.g., the same or a different thermoplastic adhesive as in the inner adhesive layer 1239 and/or the first outer adhesive layer 1235). In other embodiments, however, any suitable adhesive, such as an epoxy or glue may be used.

In some embodiments, the first and second outer layers 834, 836 may be bonded together and/or formed from the same material. The first and second outer layer 834, 836 may also be molded or bonded onto the remaining layers (e.g., along their edges) and form a single outer layer.

The layers, their arrangements, and the materials described in FIG. 12 are exemplary. Additional or fewer layers may be implemented in other embodiments. The arrangement of the various layers and the materials used may also differ in other embodiments.

Figure 13:
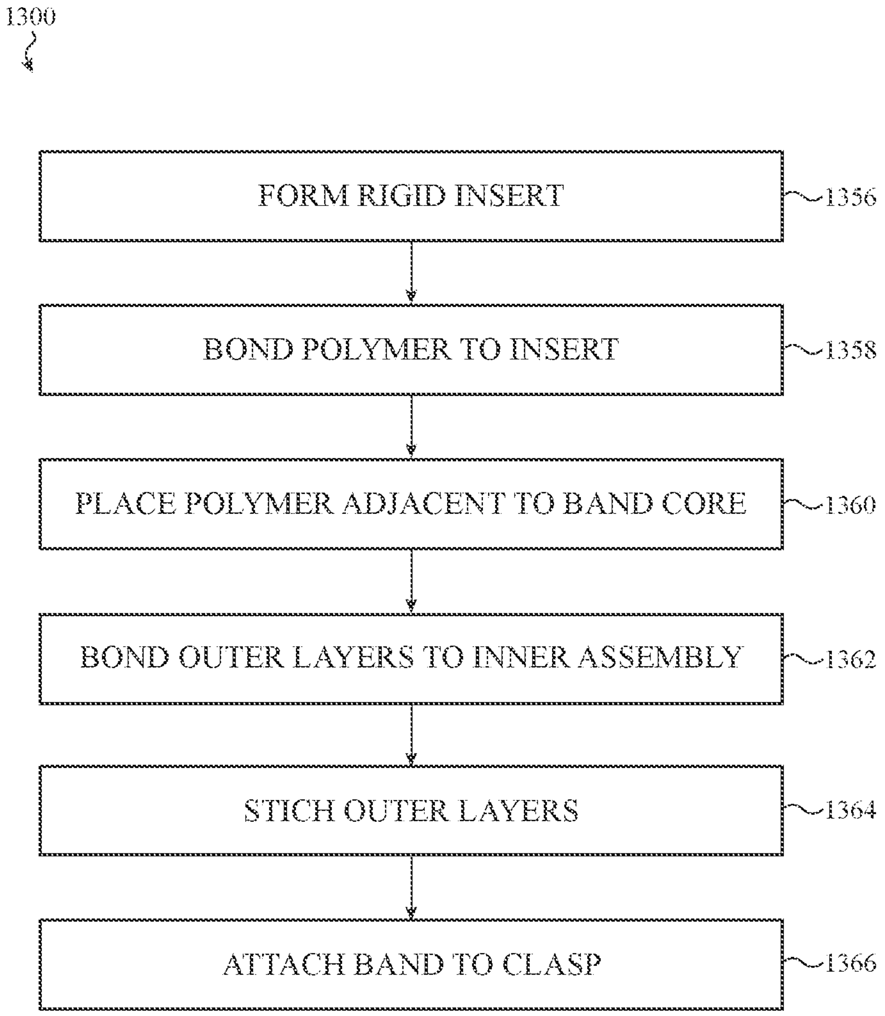
FIG. 13 depicts a flow diagram illustrating a method for assembling a band for a wearable device.

FIG. 13 depicts a flow diagram illustrating a method for assembling a band for a wearable device. The band may be the head band (e.g., the first band), discussed above. The method 1300 includes step 1356, where a rigid insert is formed. The rigid insert may be formed from a variety of suitable rigid materials. Example materials include metal or metal alloy (e.g., stainless steel, aluminum, and so on), plastic, silicone, glass, ceramic, fiber composite, or other suitable materials, or a combination of these materials. The rigid insert may be formed using an appropriate method, such as casting, molding, machining, extruding, rolling, milling, turning, grinding, cutting, etc. The rigid insert may also be previously formed and included in the assembly of the band.

At step 1358 a polymer filler is bonded to the insert. The polymer filler may be formed through a variety of methods. For example, the rigid insert may be placed into a mold and the polymer may be injected into the mold to form the filler and bond it to the rigid insert. The polymer filler 828 may be formed from a suitable material, such as polyurethane, polyvinylchloride, rubber, or fluoroelastomer.

At step 1360 the polymer filler is placed adjacent to a core layer of the band. The core layer may be formed from woven fabric (e.g., natural or synthetic fabric), polymer (e.g., silicone, thermoplastic polyurethane (TPU), polyvinylchloride, rubber, or fluoroelastomer), leather, metal, mesh, links and/or the like. The core layer may be bonded to the polymer filler, using an adhesive or other bonding agent, or the core layer may not be bonded to the polymer filler. The core layer and polymer filler may be cut or otherwise shaped such that the adjacent edges of the core layer and polymer filler match at a uniform thickness.

At step 1362 outer layers of the band are bonded to the inner assembly of the rigid insert, the polymer filler, and the core layer. There may be a first and a second outer layer, which may be formed from woven fabric (e.g., natural or synthetic fabric), polymer (e.g., silicone, thermoplastic polyurethane (TPU), polyvinylchloride, rubber, or fluoroelastomer), leather, metal, mesh, links and/or the like. The first and second outer layers may be formed from the same material as the core layer or from different materials. The first and second outer layers may generally be formed from the same material, but in some embodiments the first outer layer may be formed from a different material than the second outer layer. The band may include additional layers, such as those depicted in FIG. 12.

At step 1364 the outer layers may be stitched together. The stitching may enhance the bonding of the band components, it may be aesthetically appealing, or both. The stitching may be performed by machine or by hand, and may include any appropriate type of stitching which promotes bonding of the band components or is otherwise desirable. In some embodiments, step 1364 may not be performed.

At step 1366 the assembled band is attached to a clasp. The band may attach to a receiving portion of a clasp, which may also be configured to attach to an additional band. While step 1366 is illustrated as part of method 1300, it may be performed in a separate method.

Attached Multifunction Device

Returning to FIG. 1, the wearable electronic device may be or include a multifunction device 101. The multifunction device 101 may include features such as time keeping, health monitoring, sports monitoring, medical monitoring, communications, navigation, computing, and/or the like. The multifunction device 101 may take the form of a smart phone, a gaming device, a digital music player, a sports accessory device, a medical device, a watch, and other types of electronic or computing device suitable for attaching, at least partially, to the wearer.

The multifunction device 101 includes a housing 110 that carries, encloses, and/or supports operational and/or functional components of the multifunction device 101. Examples of other operational or functional components that are carried, enclosed, and/or supported by the housing 110 include processing units, memory modules, displays, sensors, biosensors, wireless communication modules, speakers, microphones, haptic actuators, rotational input devices, buttons, biometric authentication sensors and systems, batteries, and so on.

The housing 110 can form an outer surface or partial outer surface (such as a protective case) for the internal components of the multifunction device 101. In the illustrated embodiment, the housing 110 is a substantially rectangular cuboid, although this configuration is not required. The housing may be cylindrical in certain embodiments, for example, or may have another geometric shape (including non-regular shapes).

The construction of the housing 110 may vary from embodiment to embodiment. For example, the housing 110 can be formed from a variety of materials including plastic, rubber, wood, silicone, glass, ceramic, fiber composite, metal or metal alloy (e.g., stainless steel, aluminum, and so on), precious metals (e.g., gold, silver, platinum, titanium, and so on), or other suitable materials, or a combination of these materials. The housing 110 can be formed of one or more components operably connected together, such as a front piece and a back piece, or a top and bottom clamshell. Alternatively, the housing 110 can be formed of a single piece (e.g., uniform body or unibody).

The multifunction device 101 typically, although not necessarily, includes a display 112. In some embodiments, the display 112 may be an analog display, such as an analog watch face. The analog watch may additionally include digital display elements (e.g., a liquid crystal display or light emitting diode display) and/or backlighting which may allow for viewing in dim or no ambient light.

In other embodiments, the display 112 may be digital and may use liquid crystal display technology, light emitting diode technology, organic light-emitting display technology, organic electroluminescence technology, electrophoretic ink, flexible display technology, or another type of display technology or combination of display technology types. The display 112 may further include a multi-touch and/or multi-force sensing touchscreen. In many examples, the display 112 may also incorporate an input device configured to receive touch input, force input, rotation input, and the like from the wearer.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device, comprising: a housing; a first band configured to attach to a first side of the housing; a second band configured to attach to a second side of the housing; and a clasp configured to attach the first band to the second band, the clasp comprising: a flexible linking portion having a first latching feature extending along a majority of a length of the flexible linking portion; a rigid linking portion having a second latching feature extending along a majority of a length of the rigid linking portion; and a hinge operably connecting the flexible linking portion and the rigid linking portion, wherein: the hinge is configured to provide rotation of the flexible linking portion with respect to the rigid linking portion until the length of the flexible linking portion is aligned with the length of the rigid linking portion, wherein the length of the flexible linking portion and the length of the rigid linking portion extend away from the hinge; and the first latching feature is configured to engage the second latching feature; and the flexible linking portion comprises a pair of arms configured to be positioned within the rigid linking portion when the first latching feature engages the second latching feature.

2. The electronic device of claim 1, wherein:

the second latching feature comprises a recess; and the first latching feature comprises a beveled edge.

3. The electronic device of claim 1, wherein the first band is further configured to attach to the clasp with a spring pin.

4. The electronic device of claim 3, wherein an end portion of the spring pin has an elliptical cross-section.

5. The electronic device of claim 3, wherein:

the spring pin partially protrudes from a periphery of the first band; and the spring pin is operably coupled to a spring positioned within the first band.

6. The electronic device of claim 5, wherein the spring is serpentine.

7. The electronic device of claim 1, wherein the first band comprises:

a first outer layer;

a second outer layer;

a rigid insert positioned between the first outer layer and the second outer layer; and a spring pin at least partially positioned within the rigid insert and configured to attach to the clasp.

8. An attachment strap for securing an electronic device to a user, the attachment strap comprising: a first band configured to attach to a first side of the electronic device; a second band configured to attach to a second side of the electronic device; a flexible linking portion comprising: a flexible linking portion first end attached to the first band; a flexible linking portion second end opposite the flexible linking portion first end; and a first latching feature between the flexible linking portion first end and the flexible linking portion second end; a rigid linking portion comprising: a rigid linking portion first end attachable to the second band; a rigid linking portion second end opposite the rigid linking portion first end; and a second latching feature between the rigid linking portion first end and the rigid linking portion second end; and a hinge rotatably connecting the flexible linking portion second end and the rigid linking portion second end, such that the flexible linking portion rotates relative to the rigid linking portion until the first latching feature engages the second latching feature; the flexible linking portion comprises a pair of arms configured to be positioned within the rigid linking portion when the first latching feature engages the second latching feature.

9. The attachment strap of claim 8, wherein:

the first latching feature extends along a majority of a length of the flexible linking portion;

the second latching feature extends along a majority of a length of the rigid linking portion; and the length of the flexible linking portion and the length of the rigid linking portion extend away from the hinge.

10. An attachment strap for securing an electronic device to a user, the attachment strap comprising: a first band; a second band; a flexible linking portion attached to the first band at one of opposing ends of the flexible linking portion, the flexible linking portion having a first latching feature between the opposing ends of the flexible linking portion; a rigid linking portion attached to the second band at one of opposing ends of the rigid linking portion, the rigid linking portion having a second latching feature between the opposing ends of the rigid linking portion; and a hinge rotatably connecting the other of the opposing ends of the flexible linking portion and the other of the opposing ends of the rigid linking portion, such that the flexible linking portion rotates relative to the rigid linking portion until the first latching feature engages the second latching feature; the flexible linking portion comprises a pair of arms configured to be positioned within the rigid linking portion when the first latching feature engages the second latching feature.

11. The attachment strap of claim 10, wherein:

the first latching feature extends along a majority of a length of the flexible linking portion;

the second latching feature extends along a majority of a length of the rigid linking portion; and the length of the flexible linking portion and the length of the rigid linking portion extend away from the hinge.

* * * * *